US007797586B2

(12) United States Patent
Kuroki

(10) Patent No.: US 7,797,586 B2
(45) Date of Patent: Sep. 14, 2010

(54) IMAGE FORMING APPARATUS WITH MEMORY PROPERLY ERROR-CHECKED

(75) Inventor: Akihiko Kuroki, Osaka (JP)

(73) Assignee: Kyocera Mita Corp., Osaka (JP)

( * ) Notice: Subject to any disclaimer, the term of this patent is extended or adjusted under 35 U.S.C. 154(b) by 938 days.

(21) Appl. No.: 11/601,651

(22) Filed: Nov. 20, 2006

(65) Prior Publication Data

US 2007/0174743 A1 Jul. 26, 2007

(30) Foreign Application Priority Data

| Nov. 18, 2005 | (JP) | ............................. 2005-334065 |
| Nov. 18, 2005 | (JP) | ............................. 2005-334066 |
| Nov. 18, 2005 | (JP) | ............................. 2005-334067 |
| Nov. 18, 2005 | (JP) | ............................. 2005-334068 |
| Nov. 18, 2005 | (JP) | ............................. 2005-334069 |
| Nov. 18, 2005 | (JP) | ............................. 2005-334070 |

(51) Int. Cl.
*G06F 11/00* (2006.01)
(52) U.S. Cl. ...................................................... 714/46
(58) Field of Classification Search .................... 714/46
See application file for complete search history.

(56) References Cited

U.S. PATENT DOCUMENTS

| 4,615,609 | A | * | 10/1986 | Honma | ........................ 399/88 |
| 5,241,657 | A | * | 8/1993 | Fine et al. | .................... 345/501 |
| 5,367,697 | A | * | 11/1994 | Barlow et al. | ............... 713/330 |
| 5,481,335 | A | * | 1/1996 | Furuichi et al. | ................ 399/9 |
| 5,586,228 | A | * | 12/1996 | Tokishige et al. | .......... 358/1.16 |
| 5,638,163 | A | * | 6/1997 | Nourrcier, Jr. | ............. 356/5.01 |
| 7,010,502 | B1 | * | 3/2006 | Hoshizawa et al. | ........... 705/26 |

FOREIGN PATENT DOCUMENTS

| JP | 2017556 A | 1/1990 |
| JP | 3159774 A | 7/1991 |
| JP | 6012335 A | 1/1994 |
| JP | 6243211 A | 9/1994 |

(Continued)

OTHER PUBLICATIONS

AN3932: "Watchdogs Improve System Reliability—How to Choose the Right Part", Application-note 3932, Copyright © by Maxim Integrated Products Mar. 13, 2003.*

*Primary Examiner*—Scott T Baderman
*Assistant Examiner*—Yair Leibovich
(74) *Attorney, Agent, or Firm*—Browdy and Neimark, PLLC

(57) ABSTRACT

The whole area of volatile memories is equally divided into 16 memory blocks which are separated into 4 groups each having 4 memory blocks located away from each other. Every one of the 4 groups is selected for error-checking on memory at a power-on and is shifted sequentially. An image for selecting a plurality of error-checking types on memory is displayed on a control panel, and error-checking on memory is performed according to a user's selection. In another embodiment, instead of at a power-on, a memory check is performed as a preprocessing of a power-off, and the result of the check is stored in a non-volatile memory to display it at the next power-on. The error-checking on memory may be performed if the number of power-on times is equal to a set time, if an abnormality has occurred, or if the present time is equal to a set time.

15 Claims, 26 Drawing Sheets

FOREIGN PATENT DOCUMENTS

| | | | |
|---|---|---|---|
| JP | 7221902 A | 8/1995 |
| JP | 8030152 A | 2/1996 |
| JP | 08147122 | 6/1996 |
| JP | 8265530 | 10/1996 |
| JP | 8265530 A | 10/1996 |
| JP | 8282065 A | 10/1996 |
| JP | 09080982 | 3/1997 |
| JP | 9091171 A | 4/1997 |
| JP | 9282240 A | 10/1997 |
| JP | 10-032691 | 2/1998 |
| JP | 2002-084383 | 3/2002 |
| JP | 2002268953 A | 9/2002 |
| JP | 2003-044249 | 2/2003 |
| JP | 2005135260 A | 5/2005 |
| JP | 2005151032 A | 6/2005 |
| JP | 2005209052 A | 8/2005 |
| JP | 2005246838 A | 9/2005 |

* cited by examiner

Fig.9

| Block | Content | Memory |
|---|---|---|
| B00 | ERROR-CHECK AT 'i = 0' | NORMAL MEMORY |
| B01 | ERROR-CHECK AT 'i = 1' | |
| B02 | ERROR-CHECK AT 'i = 2' | |
| B03 | ERROR-CHECK AT 'i = 3' | |
| B10 | ERROR-CHECK AT 'i = 0' | FIRST OPTION MEMORY |
| B11 | ERROR-CHECK AT 'i = 1' | |
| B12 | ERROR-CHECK AT 'i = 2' | |
| B13 | ERROR-CHECK AT 'i = 3' | |
| B20 | ERROR-CHECK AT 'i = 0' | SECOND OPTION MEMORY |
| B21 | ERROR-CHECK AT 'i = 1' | |
| B22 | ERROR-CHECK AT 'i = 2' | |
| B23 | ERROR-CHECK AT 'i = 3' | |
| B30 | ERROR-CHECK AT 'i = 0' | |
| B31 | ERROR-CHECK AT 'i = 1' | |
| B32 | ERROR-CHECK AT 'i = 2' | |
| B33 | ERROR-CHECK AT 'i = 3' | |

N = 1~500

N = 501~600

N > 600

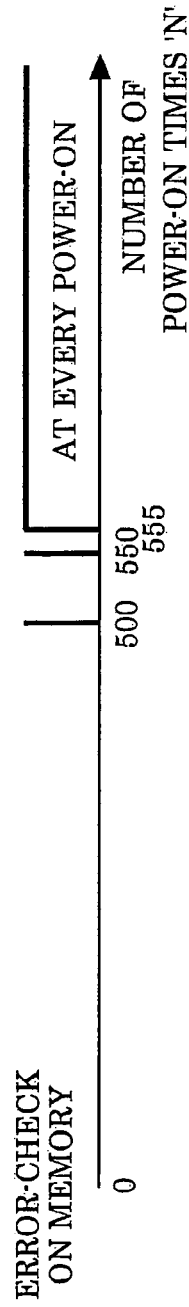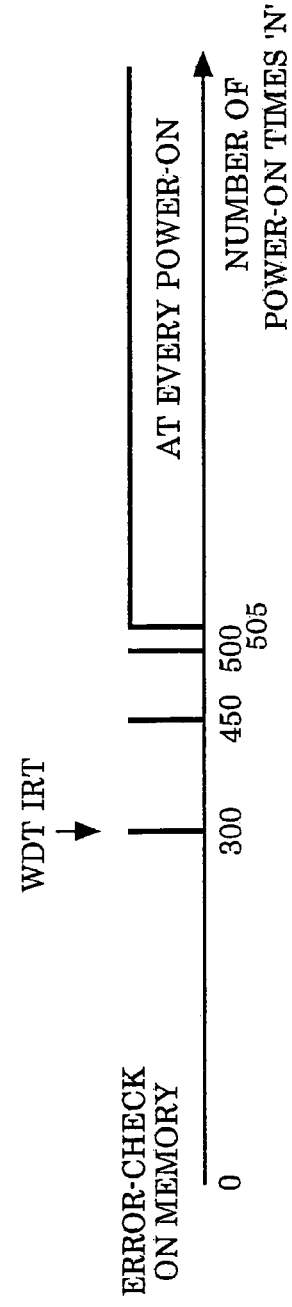

IMAGE FORMING APPARATUS WITH MEMORY PROPERLY ERROR-CHECKED

TECHNICAL FIELD

The present invention relates to image forming apparatuses which form images on sheets of paper, such as printers, copy machines, fax machines, or multifunction peripherals, and more particularly to image forming apparatuses equipped with memory devices error-checked.

BACKGROUND OF THE INVENTION

Image forming apparatuses start their system after checking whole bits of their memories so as to confirm that the state of memories is normal.

On the other hand, as formed images become more higher-resolution, more colorized, and memory price is decreasing; the capacity of a memory in an image forming apparatus becomes larger.

Accordingly, error-checking on memory at power-on may take several minutes, which makes users uncomfortable.

Meanwhile, due to the progress of both the manufacturing techniques and inspecting techniques for memories, reliability of memories has been improved. Most of the reasons of errors detected by error-checking on memory are that memories deteriorated when heated for a long time and that memory terminals did not contact enough somehow when memories were added or pulled out.

For error-checking on memory at power-on, check patterns are used of only, for example, '01010101' and '10101010' in order to shorten time. In addition 'read' and 'write' are executed only once at the same address and with the same pattern for reducing checking time.

However, a memory error occurs, for example, because of the movement of charge leaking between a memory cell and its surroundings. The amount of leaking charge is different, depending on check patterns. Whether a memory error is detected or not depends on check patterns.

For this reason, there is a case where it can not be determined whether image degradation occurs due to memory error or not when abnormality occurs or image degradation occurs due to a memory error in image data areas.

In addition, error-checking on memory has to be done in detail for enhancing memory error detection. In this case, it may take more than ten minutes.

In regard to the above, JP 04-000542A discloses that memories are divided into a plurality of blocks and that error-checking on memory is executed on a memory block in sequence at every periodical timer-interrupt.

However, normal processes may become slow if error-checking on memory is frequently executed in detail by generating timer-interrupts, which brings uncomfortable feeling to users.

JP 03-171349A discloses that error-checking on memory is executed for an idle time between data processing by an apparatus.

However, it is not described concretively that what kinds of idle times are used, and if the error-checking on memory is cancelled before its completion, the result thereof might be different in some cases. To keep away from the result, the error check has to be continued, which makes users uncomfortable.

JP 2004-178387A proposes that, for reducing user's uncomfortable feeling, error-checking on memory is not performed in principle when a system starts and that error-checking on memory is performed only if the total processing number of sheets is more than a set number or if the capacity of memories is different from that at the previous power-on.

According to this method, it is possible to reduce user's uncomfortable feeling by omitting unnecessary error-checking on memory because error-checking on memory is performed only at higher incidence of memory failure.

However, the incidence of memory error depends on manufacturers or manufacturing date of memory devices, and early failure of memory device depends on manufacturing conditions.

In a case where image quality degrades because of memory error in an image data area and in a case where a processor has gone haywire, it can not be determined for a long time whether the cause is a memory error or not, and image degradation is so partial that the image degradation can not be recognized for a long term.

Moreover, there is a case where only one bit failure of the whole memory area leads a critical situation. The larger the capacity of memories is, the more the occurrence of a memory error increases in error-checking.

In addition, even if the period from turning on to turning off the power of an image forming apparatus is the same, the number of used sheets of paper is different, depending on users or dates, so that a margin of safety has to be made larger by lowering the setting of the total number of used sheets. If the total number of sheets exceeds the set value, error-checking on memory is executed at every power-on.

Furthermore, if a processor has gone haywire, a heater in a fixing device and a sheet feeding motor may keep power-on. Therefore it is desirable to take safety measures more certainly.

SUMMARY OF THE INVENTION

Accordingly, an object of the present invention is to provide an image forming apparatus with memory error-checked when its necessity is relatively higher without giving uncomfortable feeling to a user because of waiting time.

Another object of the present invention is to provide an image forming apparatus capable of shortening the time of system startup by properly omitting error-checking on memory at a power on and capable of preventing late detection of memory error.

An image forming apparatus according to a first aspect of the present invention comprises: a processor; storage means, coupled to the processor, for storing a computer program; a volatile memory coupled to the processor; a display device coupled to the processor; and interactive inputting means, coupled to the processor, for inputting an escape instruction; wherein, when an abnormality has been detected, the computer program causes the processor to perform the steps of:

(a) showing the abnormality on a screen of the display device, and executing error-checking on the volatile memory;

(b) determining whether the escape instruction through the interactive inputting means is input or not while performing the error-checking on memory, wherein if the escape instruction is input, canceling the error-checking on memory; and (c) when a memory error has been detected, displaying information thereof on the screen of the display device.

According to this configuration, since an abnormality is displayed on the screen of the display device and error-checking on memory is performed when the abnormality occurs, it is possible to identify whether the abnormality is caused by memory error or not, so that it enables a user to deal with image degradation due to memory error. In addition, since error-checking on memory is performed when a user wants to know the cause of the abnormality, it is possible to reduce user's uncomfortable feeling even if the error-checking on memory takes a few minutes to complete. Moreover, since the error-checking on memory is cancelled when a user inputs an escape instruction through interactive inputting means while performing the error-checking on memory, it can prevent a user from feeling uncomfortable.

An image forming apparatus according to a second aspect of the present invention comprises: a processor; storage means, coupled to the processor, for storing a computer program; a volatile memory, coupled to the processor; a non-volatile memory, coupled to the processor, for storing information about an area targeted for error-checking on memory, the information indicating one of a plurality of memory blocks into which the whole memory area of the volatile memory is divided; and a display device, coupled to the processor; wherein the computer program causes the processor to perform the steps of:

(a) executing error-checking on an area indicated by the information at every power-on;

(b) updating the information so as to complete the error-checking on the whole memory area of the volatile memory in a plurality of times of power-on; and (c) if a memory error has been detected, displaying information thereof on the screen of the display device.

According to this configuration, since error-checking on memory is performed at a power-on on one of the plurality of memory blocks into which the whole memory area of the volatile memory is divided, it is possible to reduce a user's uncomfortable feeling. Furthermore, since the error-checking is completed on the whole memory area of the volatile memory within several power-on, a runaway or image degradation due to memory error can be detected earlier than a case where no error-checking on memory is performed at every power-on, so it can give a user a sense of secure.

An image forming apparatus according to a third aspect of the present invention comprises: a processor; a memory, coupled to the processor, for storing a computer program and data; a non-volatile memory, coupled to the processor, for storing interrupt information; a display device coupled to the processor; and a watchdog timer, coupled to the processor or built in the processor, for interrupting the processor by detecting a time-out; wherein the computer program causes the processor to perform the steps of:

(a) writing the interruption information in the non-volatile memory as information indicating that the interruption has occurred in response to the interruption, executing error-checking on the memory, and if a memory error has been detected, displaying information thereof on a screen of the display device (b) at a power-on, determining whether the interruption information indicates that the interruption has occurred; and (c) if the interruption has occurred, executing error-checking on the memory at a power-on, and displaying information thereof on the screen of the display device if a memory error has been detected.

According to this configuration, when the watchdog timer interrupts the processor due to an abnormality such as a runaway, error-checking on memory is performed after that and the next power-on, and information about the error is displayed if the error has been detected. Therefore it is easily determined whether the abnormality has occurred due to a memory failure or not, and the time required for finding the cause of the abnormality and dealing with the abnormality can be shortened.

An image forming apparatus according to a fourth aspect of the present invention comprises: a processor; a memory, coupled to the processor, for storing a computer program and data; a non-volatile memory, coupled to the processor, for storing information indicating numbers of times consisting of a number of total power-on times and a set number of times; a display device coupled to the processor; wherein the computer program causes the processor to perform the steps of:

(a) updating the information indicating the number of total power-on times at every power-on;

(b) if the information indicates that the number of total power-on times becomes equal to the set number of times, executing error-checking on the memory and; and (c) if a memory error has been detected, displaying information thereof on the screen of the display device.

According to this configuration, since information of the number of total power-on times is updated at every power-on, and error-checking on memory is performed on a memory if the number of total power-on times becomes equal to a set number of times the omitting number of error-checking times on memory can be relatively grater by decreasing a margin of safety than that of a case where error-checking on memory is performed after the total processing number of sheets becomes equal to a set number of sheets. Thus, it can prevent a user from feeling uncomfortable because of a long time waiting for the error-checking on memory.

An image forming apparatus according to a fifth aspect of the present invention comprises: a processor; storage means, coupled to the processor, for storing a computer program; a volatile memory coupled to the processor; interactive inputting means, coupled to the processor, for inputting information of a set time; timer means, for counting a time and interrupting the processor directly or indirectly by activating a time-out signal when the present time becomes equal to the set time; and a display device coupled to the processor; wherein the computer program causes the processor to perform the steps of:

(a) executing error-checking on the volatile memory in response to the interruption; and (b) displaying information that indicates a result of the error-checking on memory on a screen of the display device.

According to this configuration, since error-checking on memory is performed when the present time becomes a set time, not performed at a power-on, a user can start the system in a short time. Moreover, since a time during not using the image forming apparatus can be set as the set time, the detail error-checking on memory can be performed with taking a comparatively long time, and it will be unnecessary to change to a normal operation while the checking. Therefore, it can prevent a user from feeling uncomfortable, and a user can know the result of the check at the next use.

An image forming apparatus according to a sixth aspect of the present invention comprises: a processor; storage means, coupled to the processor, for storing a computer program;

a volatile memory coupled to the processor; interactive inputting means, coupled to the processor, for inputting an error-checking instruction; and a display device coupled to the processor; wherein the computer program causes the processor to perform the steps of:

(a) displaying an image for selecting one or more of a plurality of error-checking types on memory on a screen of the display device;

(b) executing error-checking of a type selected through the interactive inputting means; and (c) displaying information indicating a result of the error-checking on memory on the screen of the display device.

According to this configuration, since error-checking on memory is performed in response to the error-checking instruction through an interactive inputting means, even if image degradation occurs due to a memory error before the beginning of the next error-checking on memory, it is possible to deal with this. Moreover, since error-checking on memory is performed based on user's decision, a user will not feel uncomfortable. In addition, since a selected error-checking on memory among a plurality of error-checking types on memory is performed, even if image degradation occurs due to a memory error before the beginning of the next error-checking on memory, it is possible to deal with this more appropriately.

An image forming apparatus according to a seventh aspect of the present invention comprises: a processor; storage means, coupled to the processor, for storing a computer program; a volatile memory coupled to the processor; interactive input means, coupled to the processor, for inputting a system power-off instruction; power control means, coupled to the processor, for turning off the system power in response to the system power-off instruction; and a display device coupled to the processor; wherein the computer program causes the processor to perform the steps of:

in response to the power-off instruction of the system power, executing error-checking on the volatile memory, and providing the power-off instruction to the power control means after storing information indicating a result of the error-checking on memory into the non-volatile memory; and in response to turning on the system power, reading the information of the result of the error-checking on memory stored in the non-volatile memory and displaying the information on a screen of the display device.

According to the seventh aspect of the present invention, error-checking on memory is performed as a preprocessing of a system power-off in response to a system power-off instruction, and the system power is turned off after the result of the error-checking on memory is stored in the non-volatile memory, and then in response to the next system power-on, the information indicating the result of the error-checking on memory is read from the non-volatile memory and displayed. Thus, a user can start the system in a short time and secure sufficient time to execute error-checking on memory in detail. Therefore, it enhances the detection rate of memory error. A user will be prevented from feeling uncomfortable because it is unnecessary to change to a normal operation during the error-checking on memory.

BRIEF DESCRIPTION OF THE DRAWINGS

These and other features, aspects, and advantages of the present invention will become better understood with regard to the following description, appended claims, and accompanying drawings where:

FIG. 5 is a flowchart showing the processing of a program started by power-on;

FIG. 9 is an illustration of a processing of FIG. 7;

FIGS. 17(A) and (B) are illustrations showing whether error-checking on memory is to be performed or not versus the number of total power-on times 'N';

FIG. 20 is a flowchart showing a processing of a program started by power-on;

FIG. 21 is a flowchart showing part of a processing of a program started by power-on;

FIG. 24 is a flowchart showing a processing of a program started by power-on;

DETAILED DESCRIPTION OF THE PREFERRED EMBODIMENTS

1. Common Feature to First to Eighth Embodiments

Figure 1:
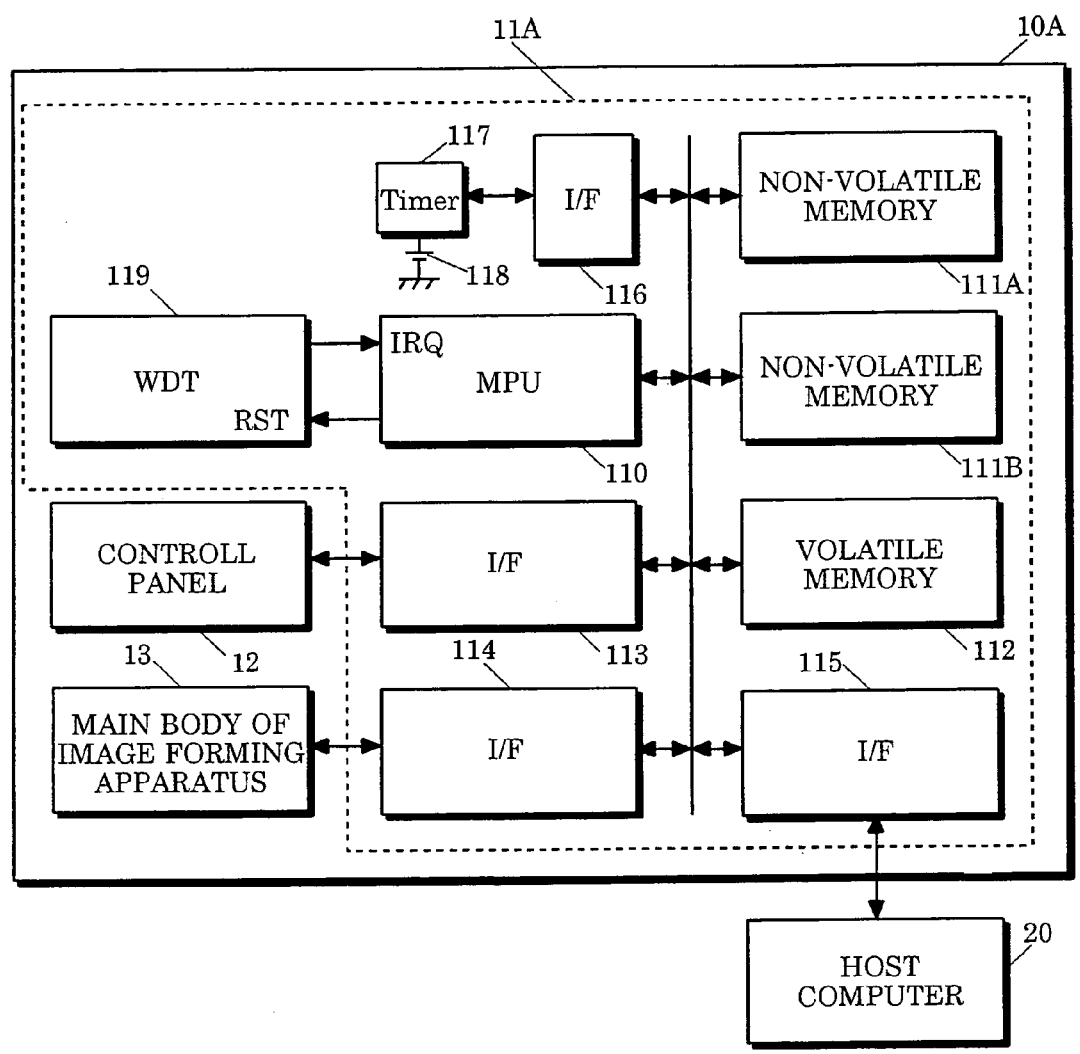
FIG. 1 is a schematic block diagram showing a common hardware configuration of an image forming apparatus according to embodiments 1-8 of the present invention.

FIG. 1 is a schematic block diagram showing a hardware configuration of an image forming apparatus according to any one of first to eighth embodiments of the present invention.

An image forming apparatus 10A is, for example, a multifunction peripheral that comprises a control panel 12 and main body which are coupled to a controller 11A. The controller 11A processes copy images read by the main body of the image forming apparatus 13 based on the information set on the control panel 12 and default values, and then causes the main body of the image forming apparatus 13 to form images. Or based on the image data and the information of setting received from an external host computer 20, the controller 11A causes the main body of the image forming apparatus 13 to form images.

In the controller 11A, a non-volatile memory 11A, an electrically rewritable non-volatile memory 111B, a volatile memory 112, and interfaces 113-116 are coupled to an MPU 110 through buses. The interfaces 113-116 are coupled to the control panel 12, the main body of the image forming apparatus 13, the external host computer 20, and a timer 117, respectively. Programs, and data such as initial values of the system are stored in the non-volatile memory 11A. The non-volatile memory 111B such as an EPROM or a flash memory stores the values set on the control panel 12 and the below-mentioned identification flag 'F' of an area to be checked.

A watchdog timer 119 is coupled to the MPU 110 as measures against out of control such as runaway occurred by a memory failure. The watchdog timer 119 activates a time-out signal after a comparative long time, for example, two seconds. This signal is provided to the interruption request terminal 'IRQ' of the MPU 110. If the watchdog timer 119 is not reset before this signal is activated, the processing of the MPU 110 is interrupted. The watchdog timer 119 restarts when it is reset. Therefore, as long as an abnormality such as a runaway does not occur, the watchdog timer 119 is reset to prevent itself from time-out. For this reason, an instruction for outputting the reset signal is inserted at proper positions in the program area of the non-volatile memory 11A. When this instruction is executed, a reset pulse is provided to the input terminal 'RST' of the watchdog timer 119 and thereby the watchdog timer 119 is reset.

Now there will be explained a method of error-checking on memory common to all the embodiments described below.

Error-checking is performed per memory block in the non-volatile memory 111A and 111B. The size of this memory block (wordage) is such one that error-checking can be completed within about, for example, 100 msec. This size depends on a type of memory and the processing speed of MPU 110.

As to error-checking on the non-volatile memory 11A, a hash value of each memory block is calculated beforehand and it is stored in the predetermined area of the non-volatile memory 111A. The MPU 110 calculates a hash value of a memory block and compares it with a corresponding value stored in the predetermined area of the non-volatile memory 11A. Then the MPU 110 determines as an error if the both values are different. The hash value herein is, for example, a hash total. The same is applied to the non-volatile memory 111B.

Figure 4:
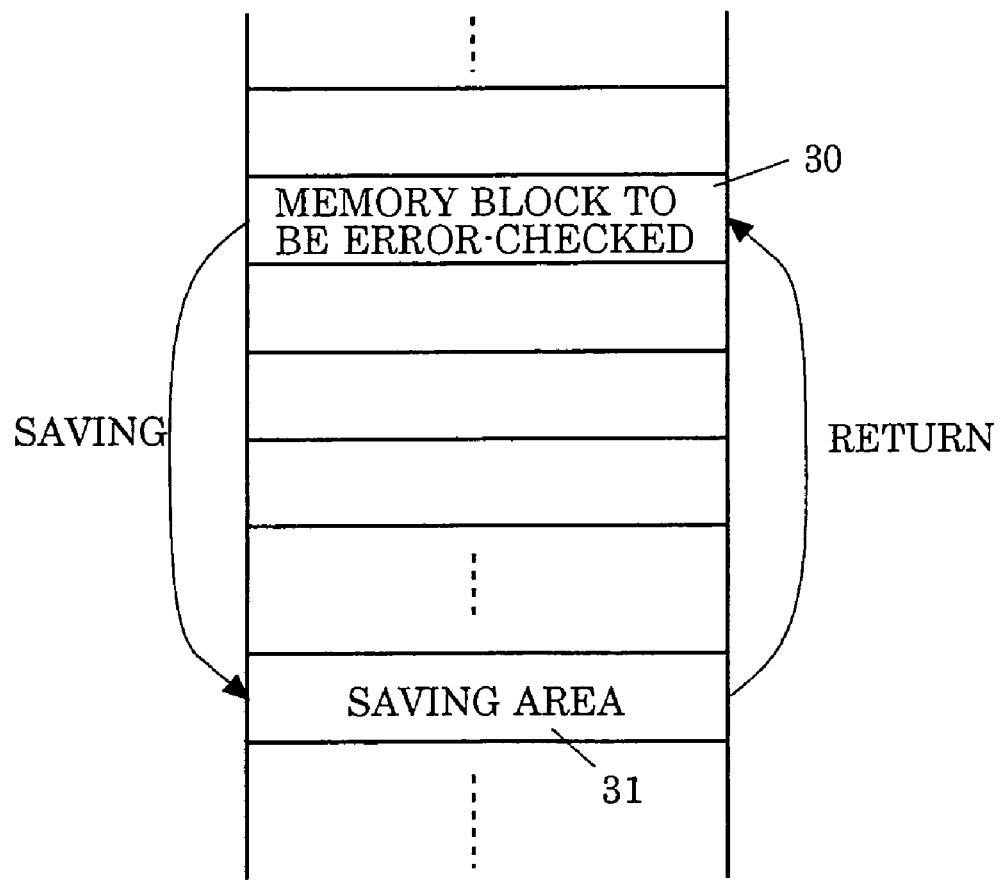
FIG. 4 is an illustration of an error check on a volatile memory.

In error-checking on the volatile memory 112, when checking a memory block 30, in order to keep contents in used area, as shown in FIG. 4, the contents in it are saved to an unused area 31 at first, and error-checking is performed on the memory block 30 in such a manner as below, and then the contents saved in the area 31 are restored in the memory block 30.

In this error-checking on the volatile memory 112, a plurality of check patterns stored in non-volatile memory 111A are, for example, '01010101', '10101010', '00000000', '11111111', and so on, and each of the patterns are written in a memory block of the volatile memory 112, then the contents written in the memory block are read and compared with the written contents whether they are matched or not. If not, it is determined that a memory error is detected.

2. First Embodiment

The first embodiment of the present invention will be explained using a flowchart.

Figure 2:
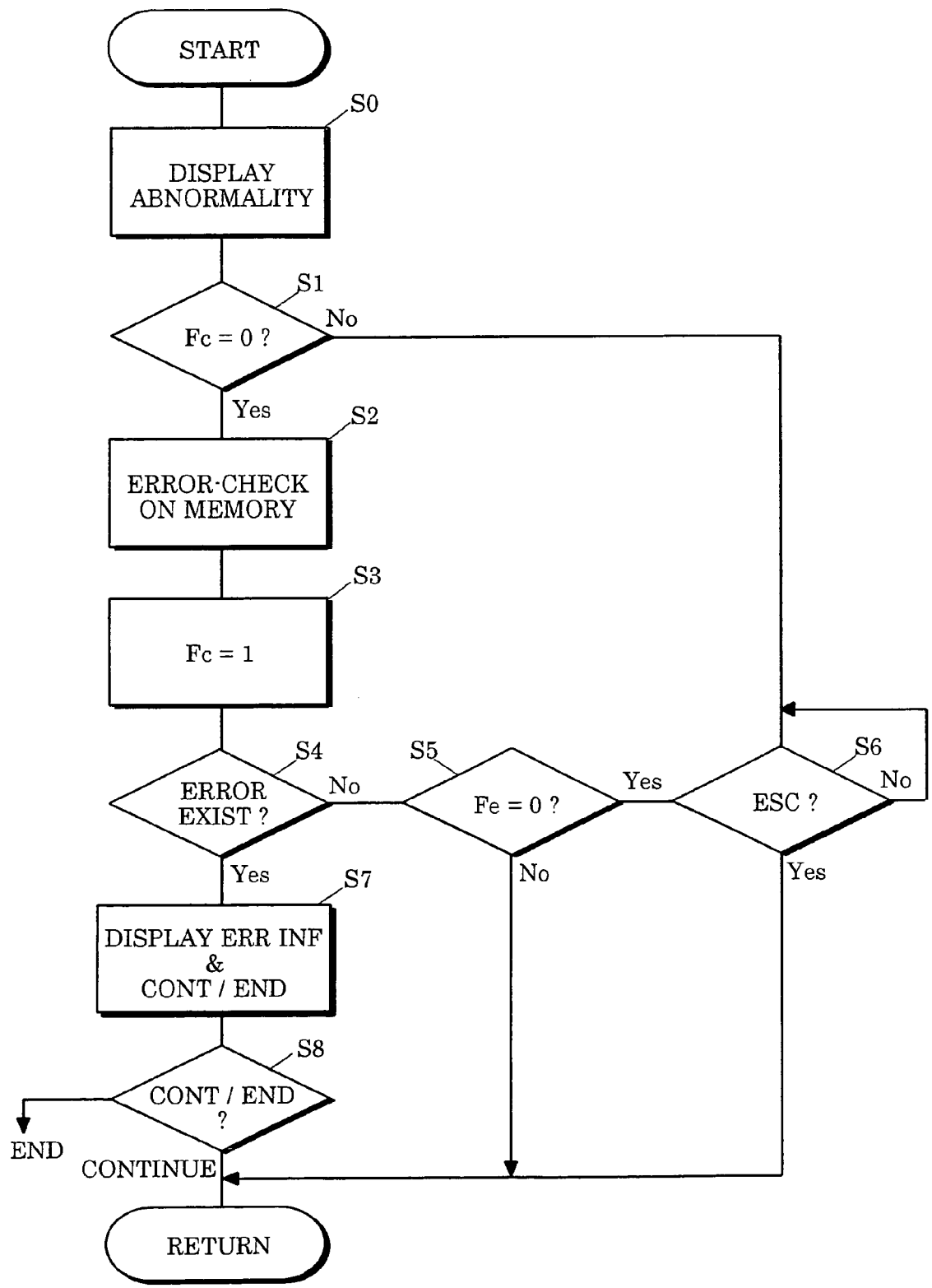
FIG. 2 is a flowchart showing a procedure of a program started when a predetermined abnormality is detected.

FIG. 2 is a flowchart showing the processing of a program started when predetermined abnormalities are detected.

Each of the predetermined abnormalities has a possibility of cause considered as a memory error. Such abnormalities include, for example, an access range violation error, an overflow error, and a divided-by-zero error. Note that error-checking on memory may be executed by adding to the definition of 'the predetermined abnormality' such as a paper jam of error that generally takes a long time to get rid of the cause. The reference characters in parenthesis represent step identification in the drawings.

(S0) A kind of an abnormality is displayed on the control panel 12. If the display size of the control panel 12 is not enough to show the whole message, only an error code is displayed.

(S1) If a check completes flag 'Fc' is equal to '0', the process goes to step S2, or else, the process goes to step S6. The initial value of the check complete flag 'Fc' is equal to '0'.

(S2) As described later, error-checking is performed on the non-volatile memory 111A, 111B, and the volatile memory 112 in detail.

(S3) The check complete flag 'Fc' is changed to '1'.

(S4) If an error is not detected at step S2, the process goes to step 5, or else, the process goes to step S7.

(S5) If an escape flag 'Fe' is '0', the process goes to step S6, or else, the process of FIG. 2 ends to return to the process before the abnormality occurrence.

(S6) To let a user confirm abnormality information displayed on the control panel 12, the process waits until the user push any key on the control panel 12, and then the processing of FIG. 2 ends.

(S7) The information such as a memory error address detected in step S2, is displayed on the control panel 12. Moreover, for user's decision whether the process continues or ends, these alternatives are displayed on the control panel 12.

(S8) If a user chooses 'continue', the processing of FIG. 2 ends and returns to the process before the abnormality occurs, or else, the process ends and the system may be turned off.

Figure 3:
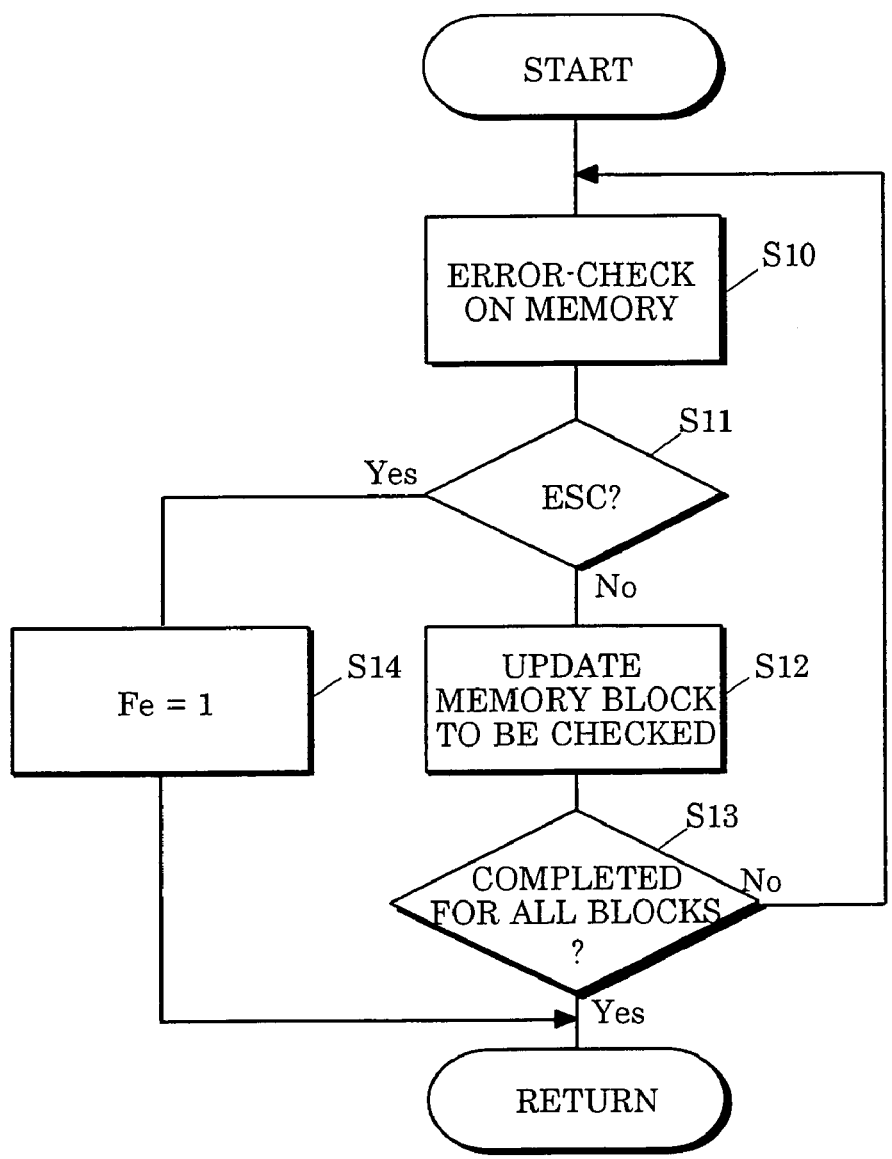
FIG. 3 is a detailed flowchart of the processing of step S2 shown in FIG. 2.

FIG. 3 is a flowchart showing a detailed process at step S2 described above.

(S10) The error-checking is performed on one memory block.

(S11) If any key is not pushed on the control panel 12, the process goes to step S12, or else, the process goes to step 14.

When a user looks at an error message and decides that the cause of the error is not a memory error or that it is necessary to execute an image processing such as printing immediately, any key should be pushed on the control panel 12.

(S12) By shifting the top address of a memory block to be checked by a predetermined value, the next memory block to be checked is updated.

(S13) By this shift, if the next memory block becomes out of the storage area, it means that all the memory checks are completed, and then the process goes to step S3 shown in FIG. 2, or else, the process goes back to step S10.

(S14) The escape flag 'Fe' is changed to '1' and the process goes to step S3 shown in FIG. 2.

In this case, if a memory error has not detected in step S2, the process goes through step S4 and S5 to end the processing of FIG. 2, then the process returns to the process before an abnormality occur.

According to the first embodiment, when an abnormality is detected, an error message is displayed on the control panel 12 and error-checking on memory is performed. Therefore, a user is able to know whether the abnormally has occurred by a memory error or not, which enables a user to deal with image degradation caused by the memory error. In addition, error-checking on memory is performed when a user want to know the cause of the error, which enables a user to reduce their uncomfortable feeling even if it takes a long time to check memory.

Moreover, during error-checking on memory, if a user inputs an escape instruction by pushing any key on the control panel 12, the error-checking ends. This prevents a user from becoming uncomfortable.

Furthermore, because it is determined whether an escape instruction is input or not before error-checking on the next memory block is performed after error-checking on one-memory block is completed, although the error-checking ends by inputting the escape instruction, it is possible to use the results of error-checking on respective blocks performed until then.

Additionally, using the check complete flag 'Fc', if 'Fc' is equal to '1', a further error-checking is not performed, so that even if the same or different abnormalities occur several times while the power is on, the error-checking caused by an abnormality is performed only once. This also prevents a user from becoming uncomfortable.

3. Second Embodiment

In a second embodiment of the present invention, the watchdog timer 119 shown in FIG. 1, which is not used in the first embodiment, is used.

Figure 5:
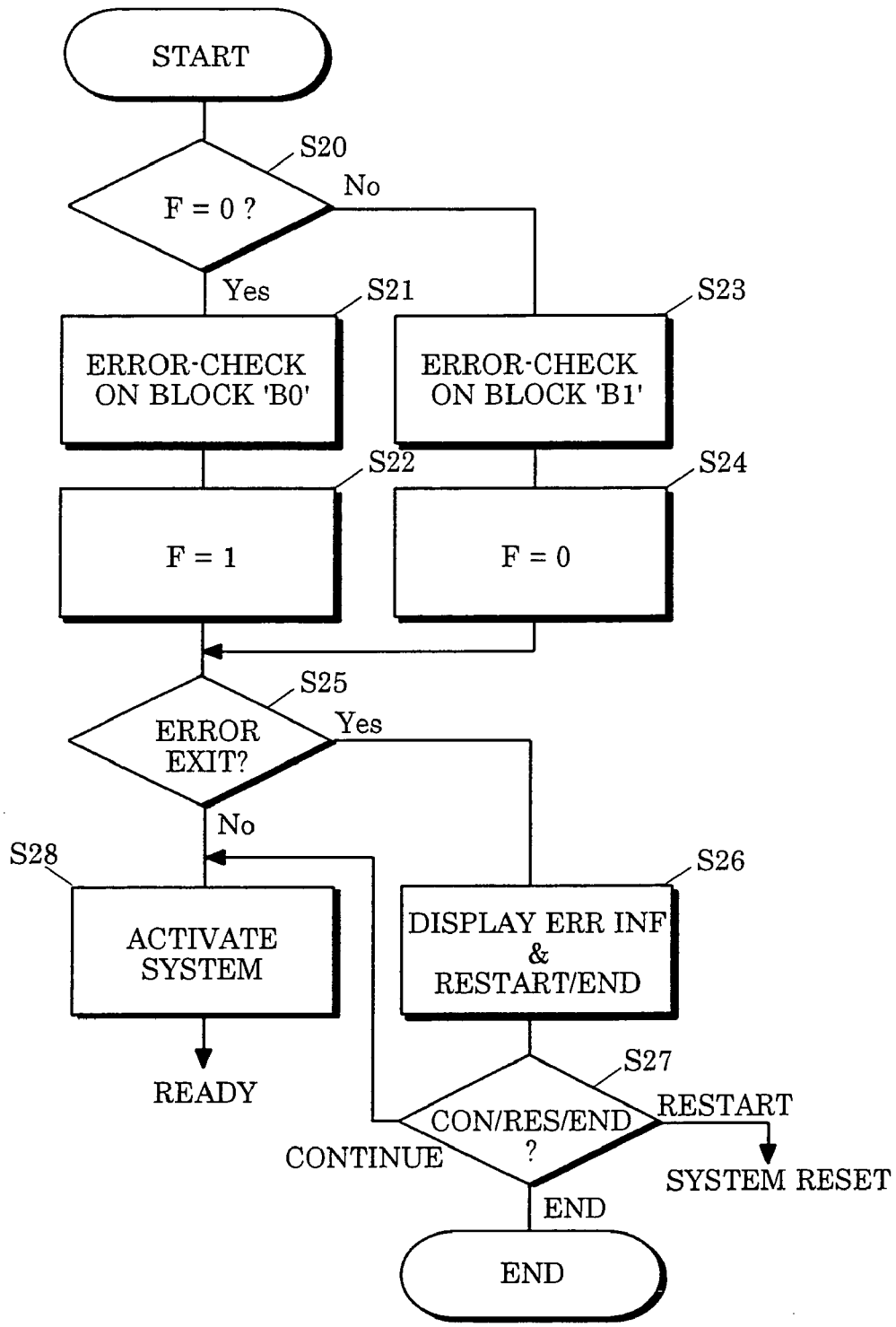

FIG. 5 is a flowchart showing the processing of a program stored in the non-volatile memory 11A. This program starts when the power is turned on.

(S20) If the identification flag of an area to be checked 'F' is '0', the process goes to step S21. If the flag 'F' is '1', the process goes to step S23.

Figure 8:
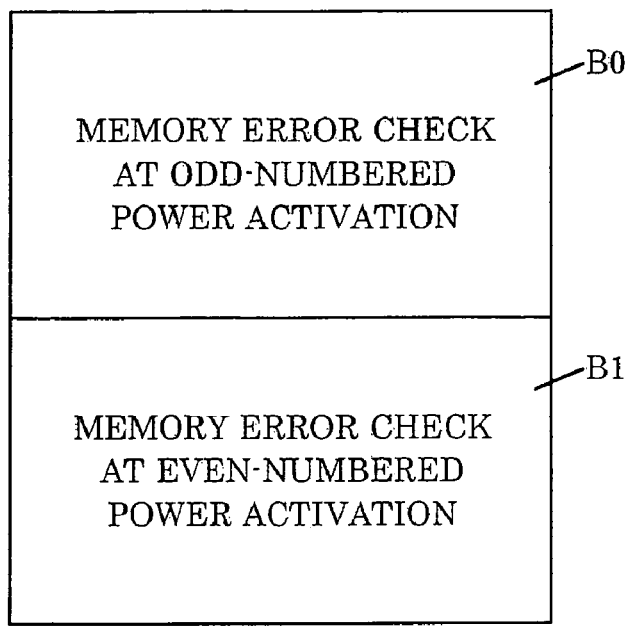
FIGS. 8 (A) and (B) are illustrations of a processing of FIG. 5 and FIG. 7, respectively.
Figure 8:
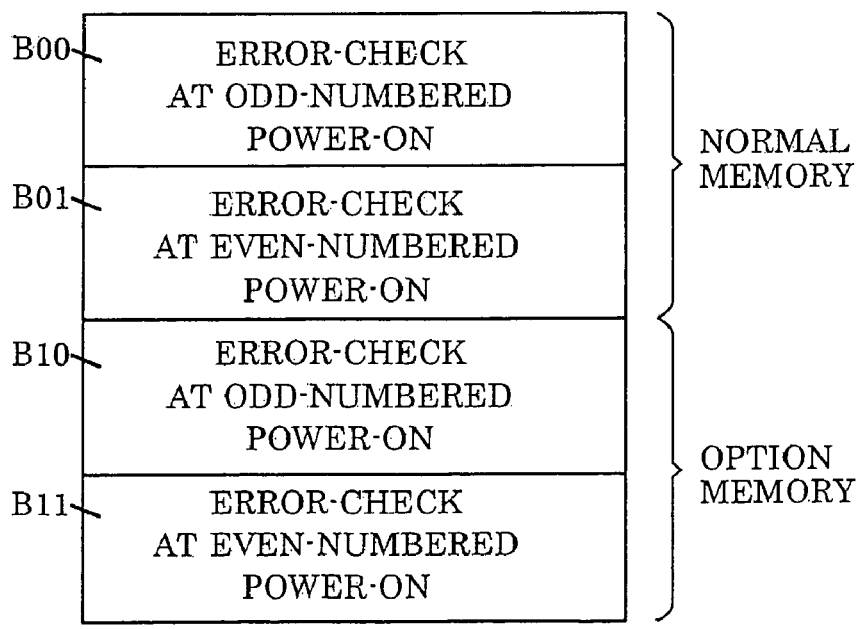

(S21) The whole area of the volatile memory 112 is divided into two parts: 'B0' and 'B1', and error-checking is performed on the memory block 'B0'. FIG. 8 (A) shows a memory block 'B0' and memory block 'B1', which are two parts of the whole area of the volatile memory 112.

(S22) The identification flag 'F' is changed to '1', and then the process goes to step S25.

(S23) The error-checking is performed on the memory block 'B1', which is the other part of the storage area of the volatile memory 112.

(S24) The identification flag 'F' is changed to '0'.

(S25) If an error is detected, the process goes to step S26, or else, the process goes to step S28.

(S26) The MPU 110 displays the information indicating where memory error has occurred, on the control panel 12. Moreover, for the purpose of providing the alternatives to a user: resetting to restart the system; continuing the process; or finishing the process. These alternatives are displayed on the control panel 12.

(S27) If the 'restart' is selected by a user, the MPU 110 resets itself and restarts the system. If the 'continue' is selected by a user, the process goes to step S28. If not, the process ends. In a case of 'end', the power of the image forming apparatus 10A may be turned off.

(S28) The MPU 110 starts up an OS (Operating System) and the applications running over it, so that the MPU 110 makes the image forming apparatus 10A ready.

Figure 6:
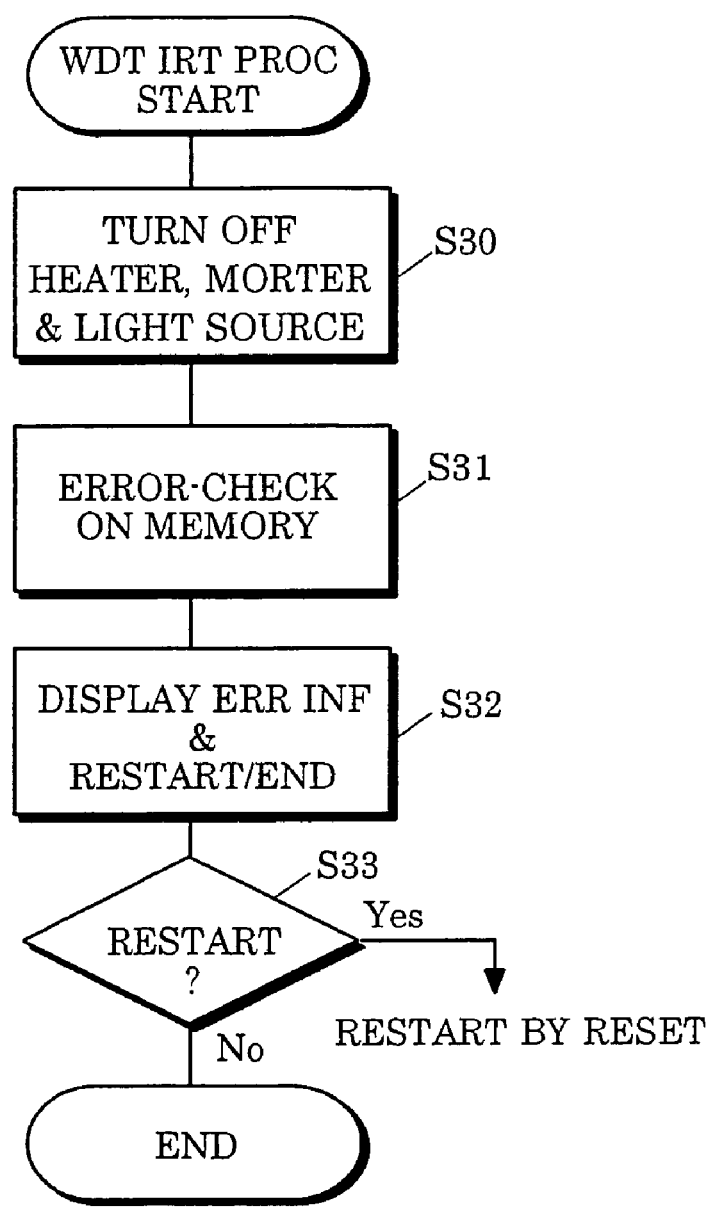
FIG. 6 is a flowchart showing a watchdog timer interruption processing.

FIG. 6 is a flowchart showing the processing of a program stored in the non-volatile memory 11A. This program is activated by the MPU 110 when the WDT (Watchdog Timer) interrupts the processing with providing the interruption request to the MPU 110 by an abnormality occurrence such as a runaway.

(S30) If at least one of the following units is power on: a heater in the fixing device, sheet feeding rollers, a motor built in the print engine or the scanner, or a light source of the scanner, which are equipped in the image forming apparatus 13, the MPU 110 turns off the unit(s) through the interface 114 so as to prevent the apparatus from damaging and ensures safety.

(S31) The MPU 110 performs the error-checking on the whole area of the non-volatile memory 111A, 111B, and the volatile memory 112.

(S32, S33) Then, the process executes the same processing of step S26 and step S27 shown in FIG. 5.

According to the second embodiment, the whole area of the volatile memory 112 is divided into two parts, and the error-checking is performed at every turn-on on the area that the flag 'F' indicates, and then the flag 'F' is inverted. Thus, this reduces the time required for the error-checking by half to ease user's uncomfortable feeling. Additionally, since turning on two times can result in error-checking on the whole area of the volatile memory 112, this enables to detect a runaway or image degradation due to the memory error earlier than the way not performing the error-checking at every turn-on in principle, which provides a sense of security to a user.

In addition, even if an abnormality occurs such as a runaway because of reducing the time required for the error-checking by half, the error-checking is performed on the whole area of the memory when the watchdog timer 119 provides the interruption request to the MPU 110. Therefore, a runaway or image degradation due to the memory error can be detected at an early stage, which provides a user a sense of security.

Note that, even if error-checking on memory is not performed at power-on, it is possible to shorten the time to find and handle the causes of an abnormality since the watchdog timer 119 triggers the error-checking.

4. Third embodiment

Depending on production dates or manufacturers of installed memory cards in the image forming apparatus 10A, the incidence of memory error is generally different. A user can not identify which installed card has a higher incidence of memory error.

Therefore, according to a third embodiment, as shown in FIG. 8(B), a normally installed memory is divided into memory blocks, for example, 'B00' and 'B01', and an optionally installed memory is divided into memory blocks, for example, 'B10' and 'B11', and then error-checking is performed on the memory blocks 'B00' and 'B10' when the number of total power-on times is an odd number, and on the memory blocks 'B01' and 'B11' when the number of total power-on times is an even number.

With this, since the error-checking is performed on a half of the whole storage area of each memory card whenever the power is on, the detection rate of memory error generally becomes higher even if the incidence of memory error is different due to the difference of memory cards.

In general, the capacity of a normally installed memory card differs from the capacity of an optional installed memory card; moreover, the optional installed memory may comprise a plurality of memory cards.

Thus, as shown in FIG. 9, the whole storage area of the volatile memory 112 is divided into many blocks which have the same storage size as each other, and error-checking is performed on a plurality of memory blocks having a predetermined block-interval. Whenever the power is turned on, blocks to be checked are shifted to the next blocks.

With this, the same advantage as described above can be obtained regardless of the configuration of the volatile memory 112 since error-checking is performed on a portion of each memory card every time.

In FIG. 9, the whole storage area is divided into 16 blocks each having the same size, and a variable 'i' whose initial value is '0' is incremented by one whenever the power is turned on, and then error-checking is performed on memory blocks, 'B0i', 'B1i', 'B2i', and 'B3i'. If the value of 'i' becomes equal to '4', it is initialized to '0'.

Figure 7:
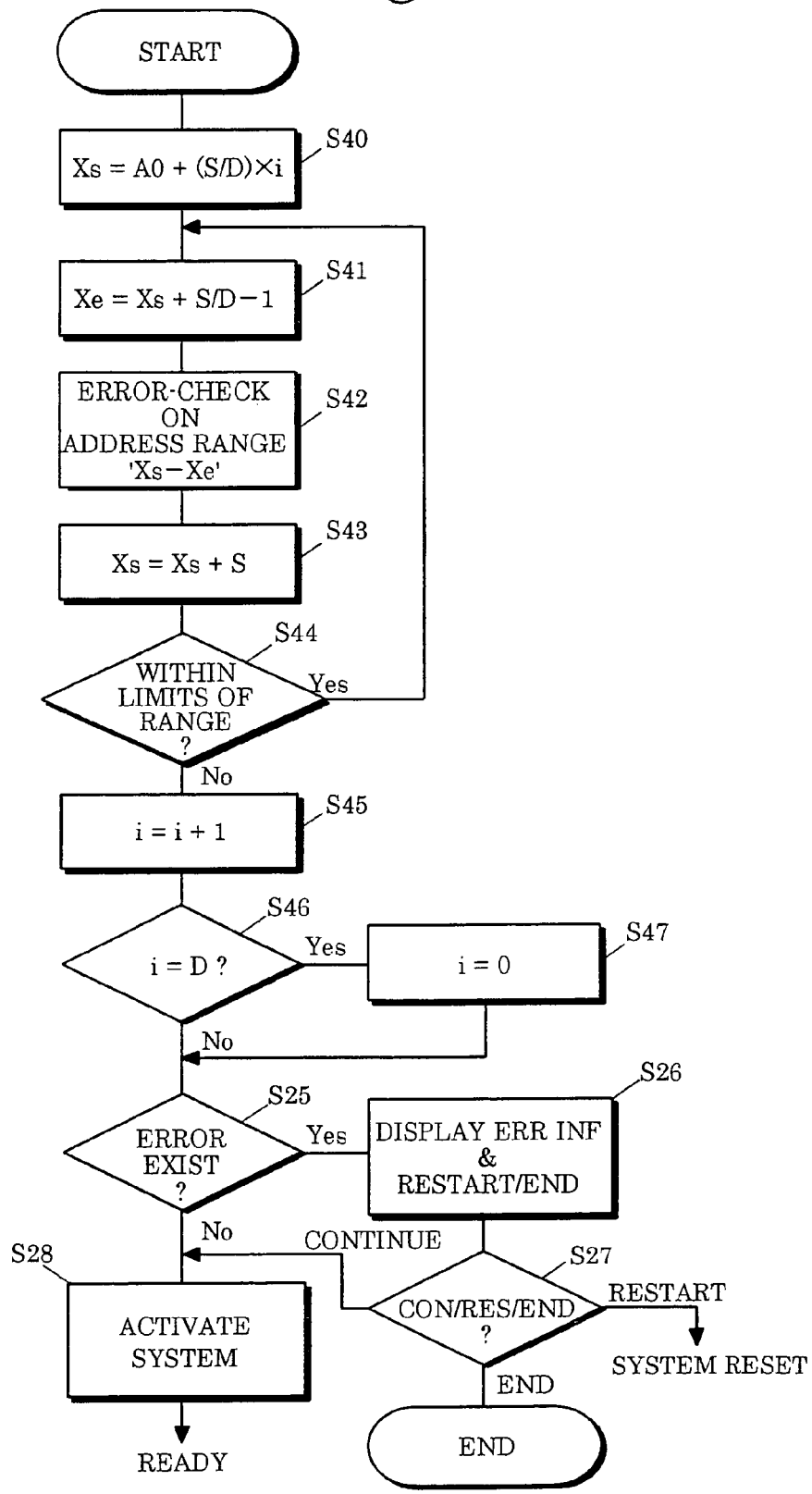
FIG. 7 is a flowchart showing the processing of a program started by power-on according to a third embodiment of the present invention.

FIG. 7 is a flowchart showing a program processing such as the above after power-on. The program is stored in the non-volatile memory 11A. In this flowchart, steps S40-S47 are processed instead of steps S20-S24 shown in FIG. 5.

The following variables and constants are used in the program.

Xs: a start address of an arbitrary memory block
Xe: an end address of this memory block
A0: the start address of the volatile memory 112
S: the size (wordage) of a storage area where error-checking is performed at a power-on
D: the number of memory blocks included in this size Of these variables, constants, and an identification variable 'i' of an area to be checked, 'A0', 'S', and 'D' are stored in the non-volatile memory 111A; the variable 'i' is stored in the non-volatile memory 111B; and 'Xs' and 'Xe' are stored in a storage area of the volatile memory 112, where error-checking is not performed at the time.

(S40) The result of 'A0+(S/D)*i' is substituted for 'Xs'.
(S41) The result of 'Xs+S/D−1' is substituted for 'Xe'.
(S42) error-checking is performed in regard to an address range from 'Xs' to 'Xe'.
(S43) 'S' is added to 'Xs'.
(S44) If 'Xs' is within the address range of the installed memory, the process goes back to step S41, or else, the process goes to step S45.
(S45) The variable 'i' is incremented by one.
(S46) If the variable 'i' is equal to 'D', the process goes to step S47, or else, the process goes to step S25.
(S47) '0' is substituted for the variable 'i', and the process goes to step S25.

Subsequent processes are the same as the processes of step S25 to S27 shown in FIG. 5.

In this way, the error-checking described above with reference to FIG. 9 is performed.

5. Fourth Embodiment

In the above third embodiment, it is not taken into consideration that the incidence of memory error changes because of secular change. Thus, in a fourth embodiment, the process as shown in FIG. 10 is executed in response to a power-on, with above consideration.

Figure 10:
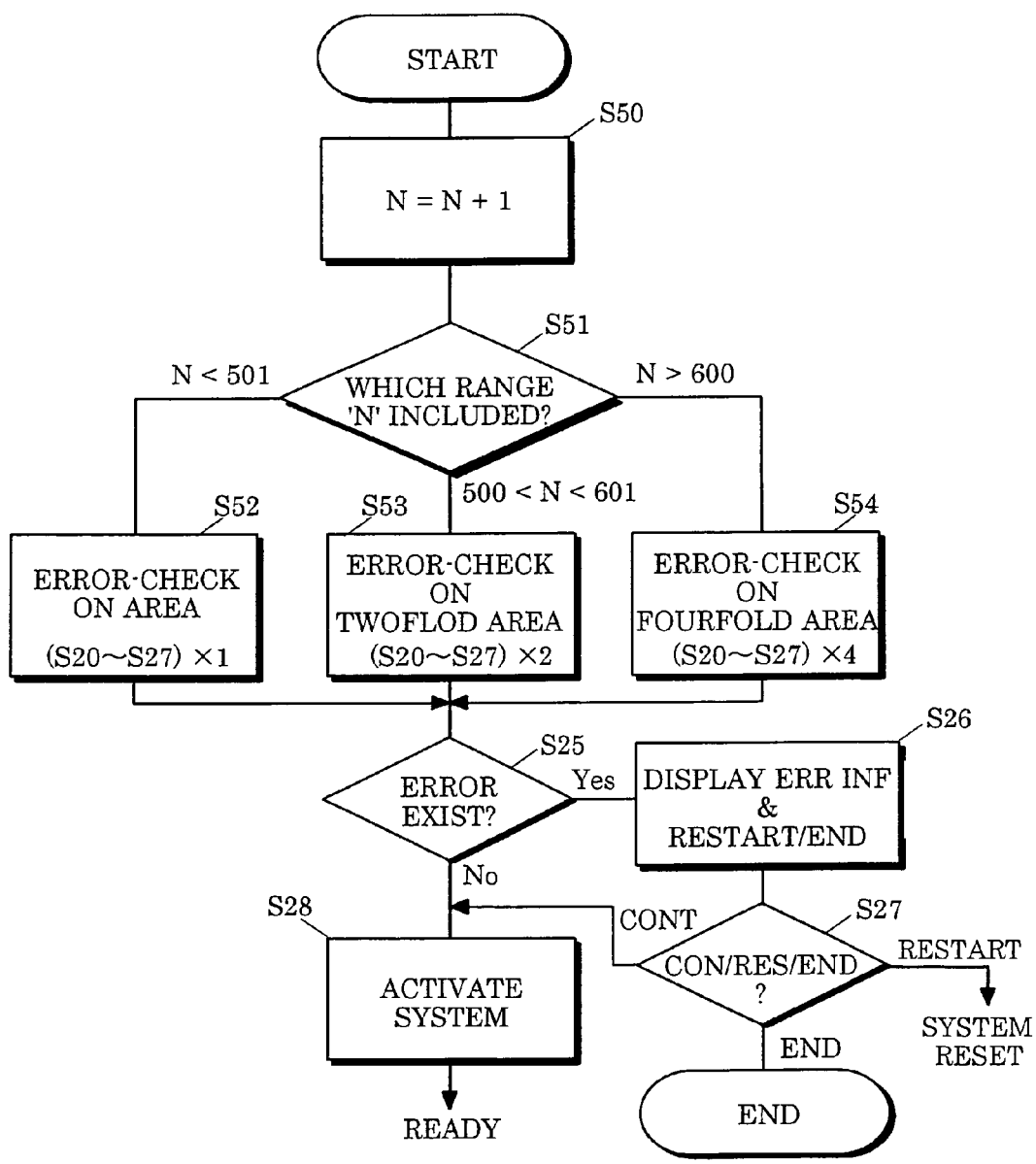
FIG. 10 is a flowchart showing a processing of a program started by power-on, according to a forth embodiment of the present invention.

In a flowchart shown in FIG. 10, steps S50-S54 are used as a substitution of step S40-S47 shown in FIG. 7.

(S50) The number of total power-on times 'N' is incremented by one. This number of total times 'N' is stored in the non-volatile memory 111B shown in FIG. 1. The initial value of 'N' is '0'.
(S51) If the number of total power-on times 'N' is less than or equal to 'N0', the process goes to step S52. If the value 'N' is in the range from 'N0+1' to 'N', the process goes to step S53. If the value 'N' is greater than or equal to 'N1+1', the process goes to step S54. For example, 'N0' is equal to '500' and 'N1' is equal to '600'.
(S52) The process from step S40 to S47 shown in FIG. 7 are executed once, and the process goes to step S25.
(S53) The processes from step S40 to S47 shown in FIG. 7 are executed twice, and the process goes to step S25.
(S54) The processes from step S40 to S47 shown in FIG. 7 are executed four times, that is, the error-checking is performed on the whole area of the volatile memory 112. Then, the process goes to step S25.

Figure 11A:
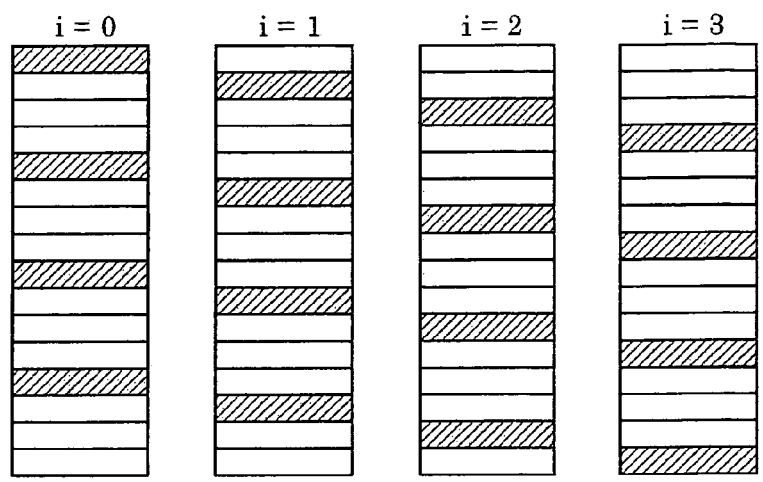
FIGS. 11(A) to (C) are illustrations of processing shown in FIG. 10.
Figure 11B:
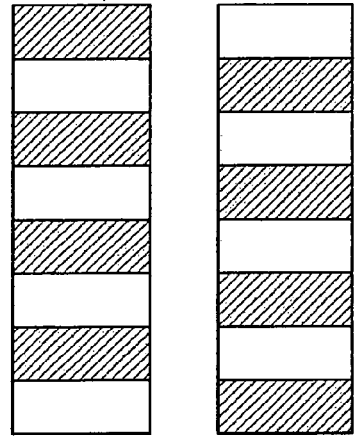
Figure 11C:
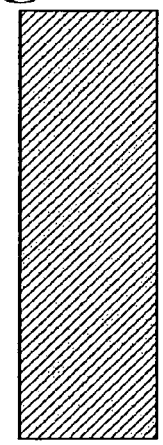

In this way of processing, if the number of power-on times 'N' is less than or equal to '500', the error-checking is performed on the areas corresponding to the value of the identification variable 'i' at every power-on as shown in FIG. 11 (A), and then the value of the identification variable 'i' is updated. In other words, error-checking on the whole area of the volatile memory 112 is completed after four times power-on.

If the number of total power-on times 'N' is in the range from '501' to '600', error-checking is performed on the areas corresponding to 'i=0' and 'i=1' or corresponding to 'i=2' and 'i=3' alternately at every power-on as shown in FIG. 11 (B).

If the number of total power-on times 'N' is greater than or equal to '601', the error-checking is performed on the whole area of the volatile memory 112 as shown in FIG. 11 (C).

According to the fourth embodiment, as the incidence of memory error increases due to the memory degradation cause by heat, the areas to be checked also increase. For this reason, it is possible to omit the error-checking properly with reducing oversights of memory error detection.

6. Fifth Embodiment

Figure 12:
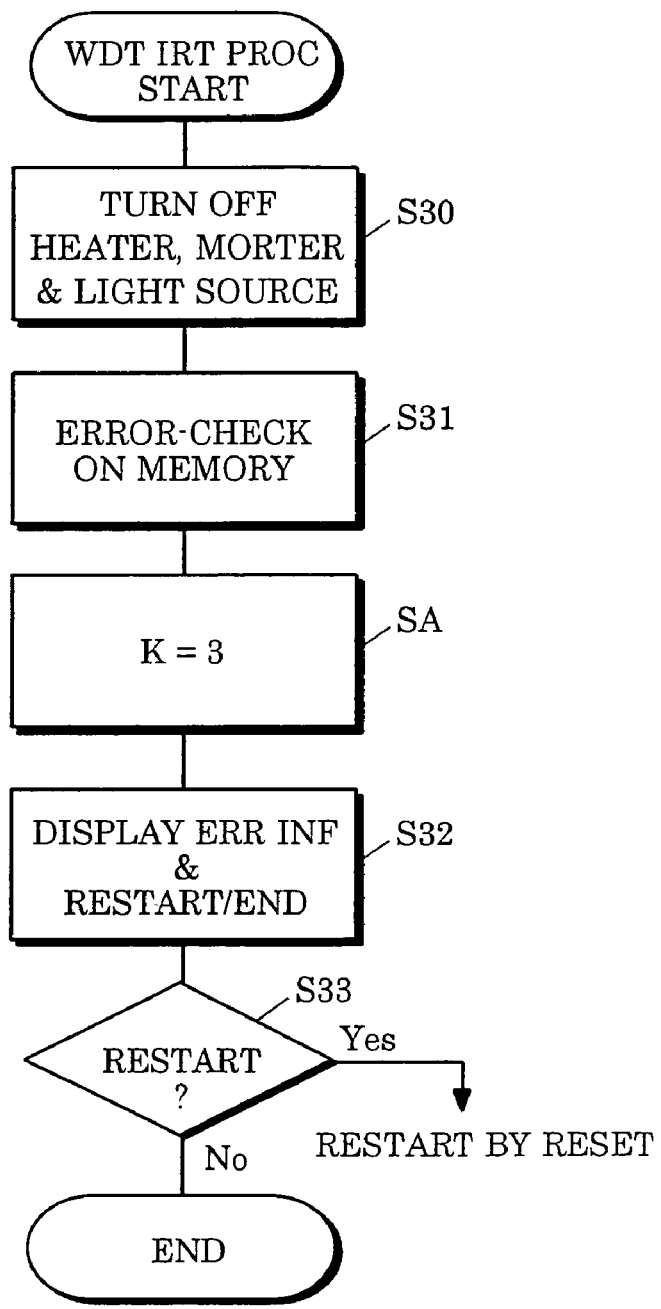
FIG. 12 is a flowchart showing a processing started when the watchdog timer interrupts an MPU in an image forming apparatus, according to a fifth embodiment of the present invention.

FIG. 12 is a flowchart showing the processing at the time when the MPU 110 is interrupted by the watchdog timer 119 in an image forming apparatus according to a fifth embodiment of the present invention.

In this interruption process, at step SA between step S31 and step S32, a number of error-checking times 'K' described below is set to greater than or equal to '1', for example, '3'. Except this point, this process is the same as the processing of FIG. 6 in the second embodiment. The number of error-checking times 'K' is stored in the non-volatile memory 111B, and has an initial value '0'.

Figure 13:
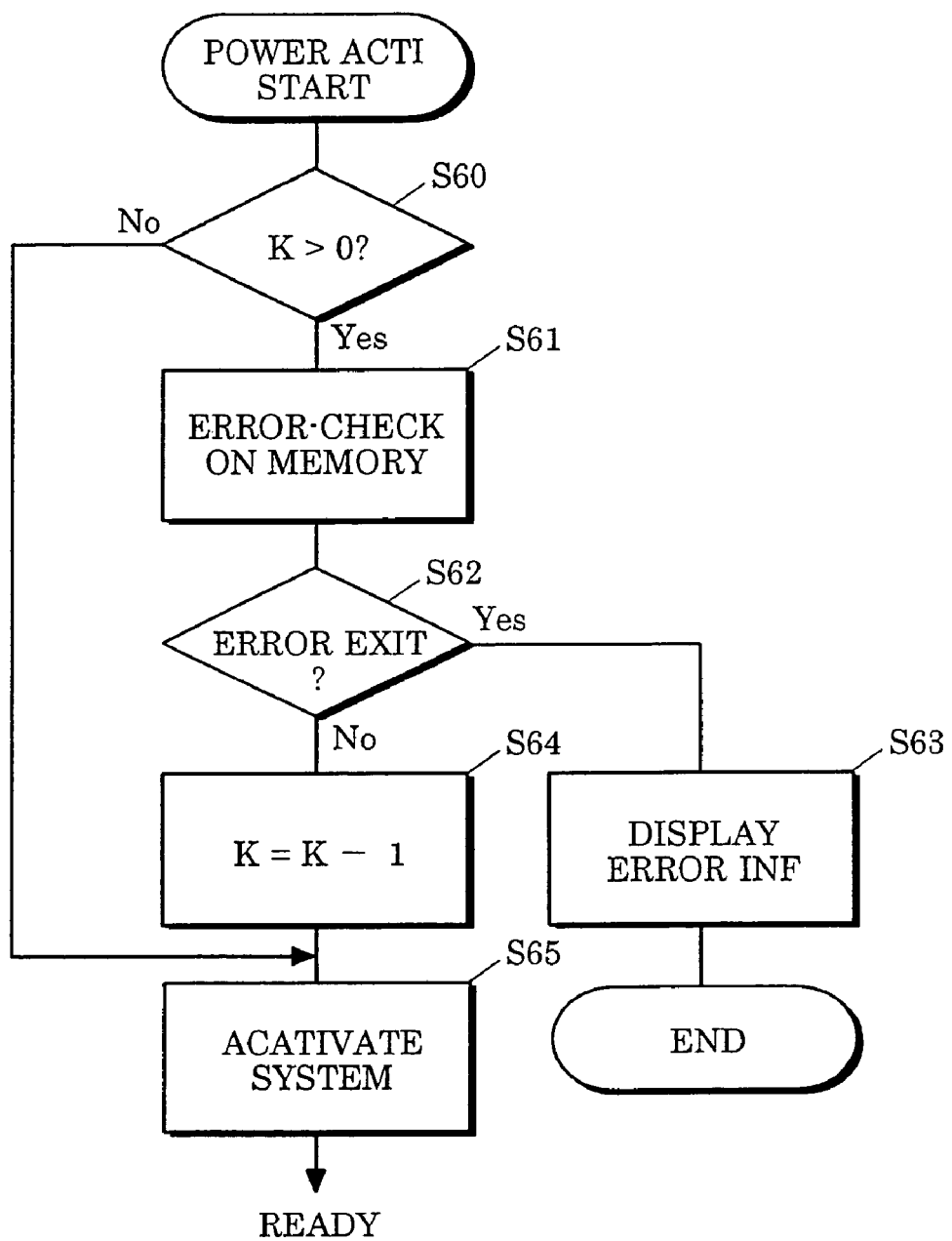
FIG. 13 is a flowchart showing a processing at power-on, according to a fifth embodiment of the present invention.

FIG. 13 is a flowchart showing the processing at power-on, which is associated with the number of error-checking times 'K'.

(S60) If 'K' is positive, the process goes to step S61, or else, the process goes to step S65.
(S61) error-checking as described above is performed.
(S62) If an error is detected, the process goes to step S63, or else, the process goes to step S64.
(S63) The error information is displayed on the control panel 12, and the process ends.
(S64) The number of error-checking times 'K' is decremented by one.
(S65) A system is activated, that is, the OS and applications running over it are activated so that the image forming apparatus goes ready.

According to the fifth embodiment, when the MPU 110 is interrupted by the watchdog timer 119 due to an abnormality such as a runaway, error-checking on memory is performed not only at the time when the error occurs, but also at every power-on within 'K' times from the error occurrence. This makes safety better.

7. Sixth Embodiment

In a sixth embodiment of the present invention, values set with the control panel 12 and a set number of times 'P' described below are stored in the non-volatile memory 111B.

A program in the non-volatile memory 111A does not execute error-checking on memory at power-on. For covering this, when an abnormality such as a runaway occur due to memory failure, there are measures which utilize the watchdog timer 119. Followings are an explanation of the measures.

Figure 14:
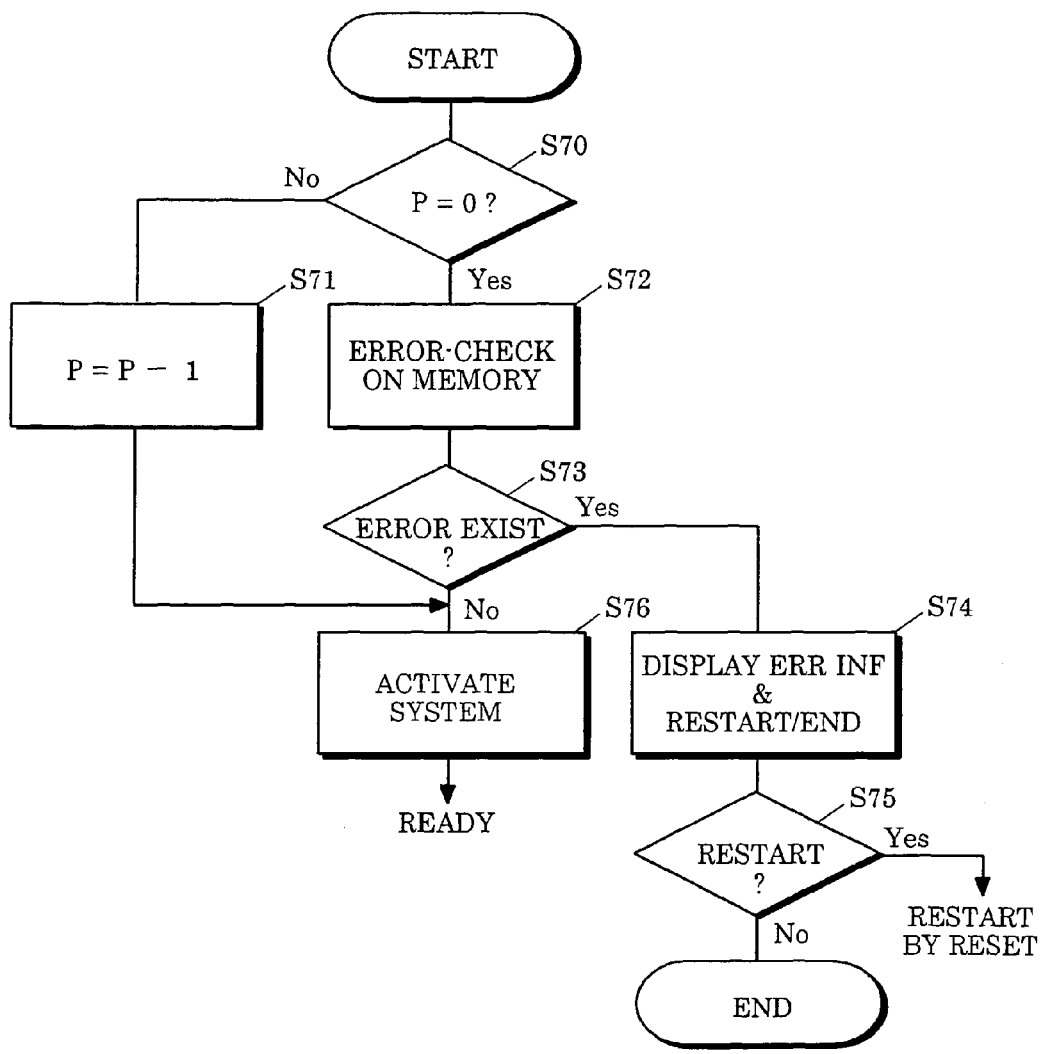
FIG. 14 is a flowchart showing a processing at power-on, according to a sixth embodiment of the present invention.

FIG. 14 shows a flowchart showing the processing of the program stored in non-volatile memory 11A, and this program is started at power-on.

(S70) If the set number of times 'P' is not '0', the process goes to step S71, or else, the process goes to step S72.

(S71) The set number of times 'P' is decremented by one, and the process goes to step S76.

(S72) The MPU 110 executes error-checking on the non-volatile memory 111A, 111B, and the volatile memory 112.

(S73) If an error is detected, the process goes to step S74, or else, the process goes to step S76.

(S74) The MPU 110 displays information indicating whether a memory error exist or not and location information of the error on the control panel 12. Moreover, in order to provide alternatives that 'the system is reset to restart' or 'the process ends' for a user, these are displayed on the control panel 12.

(S75) If 'restart' is chosen, the MPU 110 resets itself and restarts the system, or else, the process ends. In a case of 'end', the image forming apparatus 10A may be turned off.

(S76) The MPU 110 starts up the OS and applications running over it so that the MPU 110 makes the image forming apparatus 10A ready.

In the above-described process, the initial value of the set number of times 'P' is, for example, '500'. In this case, because the process goes through step S70 and S71 to step S76 until the number of total power-on times becomes '500', error-checking on memory in step S72 is not performed.

If the number of total power-on times is greater than 500, the process goes from step S70 to step S72. Therefore, error-checking on memory is performed at every power-on after that.

According to the sixth embodiment, since error-checking on memory is not performed at power-on in principle, the system can be started up in a shorter time even if the volatile memory 112 has large capacity. Moreover, after the number of total power-on times is over the set number of times, error-checking on memory is performed at every power-on. Therefore, it is possible to avoid generating a runaway or image degradation by memory error due to memory degradation under secular change.

In addition, the number of total power-on times is used as determination of error-checking start-time, not the number of used sheets of paper which greatly depends on a user, time, or circumstances. Thereby the determination of error-checking start-time is more optimized, which makes it possible to delay the error-checking start-time more than before so as to remove user's uncomfortable feeling.

Furthermore, error-checking is performed on both program and data area when the watchdog timer 119 interrupts the MPU 110 due to an abnormality such as a runaway, it is possible to delay the error-checking start-time more than before so as to remove user's uncomfortable feeling.

8. Seventh Embodiment

According to the above sixth embodiment, after the number of total power-on times 'N' exceeds the set number of times 'P', error-checking on memory is performed at every power-on. That is, whether error-checking on memory is performed or not suddenly changes. In general, this set number of times 'P', however, is set relatively small with consideration of a margin of safety, so that the change of whether error-checking on memory is performed or not can be slow. Especially, if error-checking on memory is performed at the time when the watchdog timer 119 interrupts the MPU 110, it will not be needed to perform error-checking on memory at every power-on after the number of total power-on times 'N' excesses the set number of times 'P'.

According to a seventh embodiment of the present invention, when the set number of times 'P' becomes '0', the initial value of the set number of times 'P' is updated so that it may become small.

'M(0)' is defined as initial values of 'P' after the first round. 'M(1)' is defined as initial values of 'P' after the second round. For example, the initial value of 'P' at the first round is 500; the initial value of 'P' at the second round designated as 'M(0)' is '50'; the initial value of 'P' at the third round designated as 'M(1)' is '5'; and the processing of FIG. 14 is repeated. These values of initial 'P', M(0) and M(1) are stored in the non-volatile memory 111B shown in FIG. 1.

Figure 15:
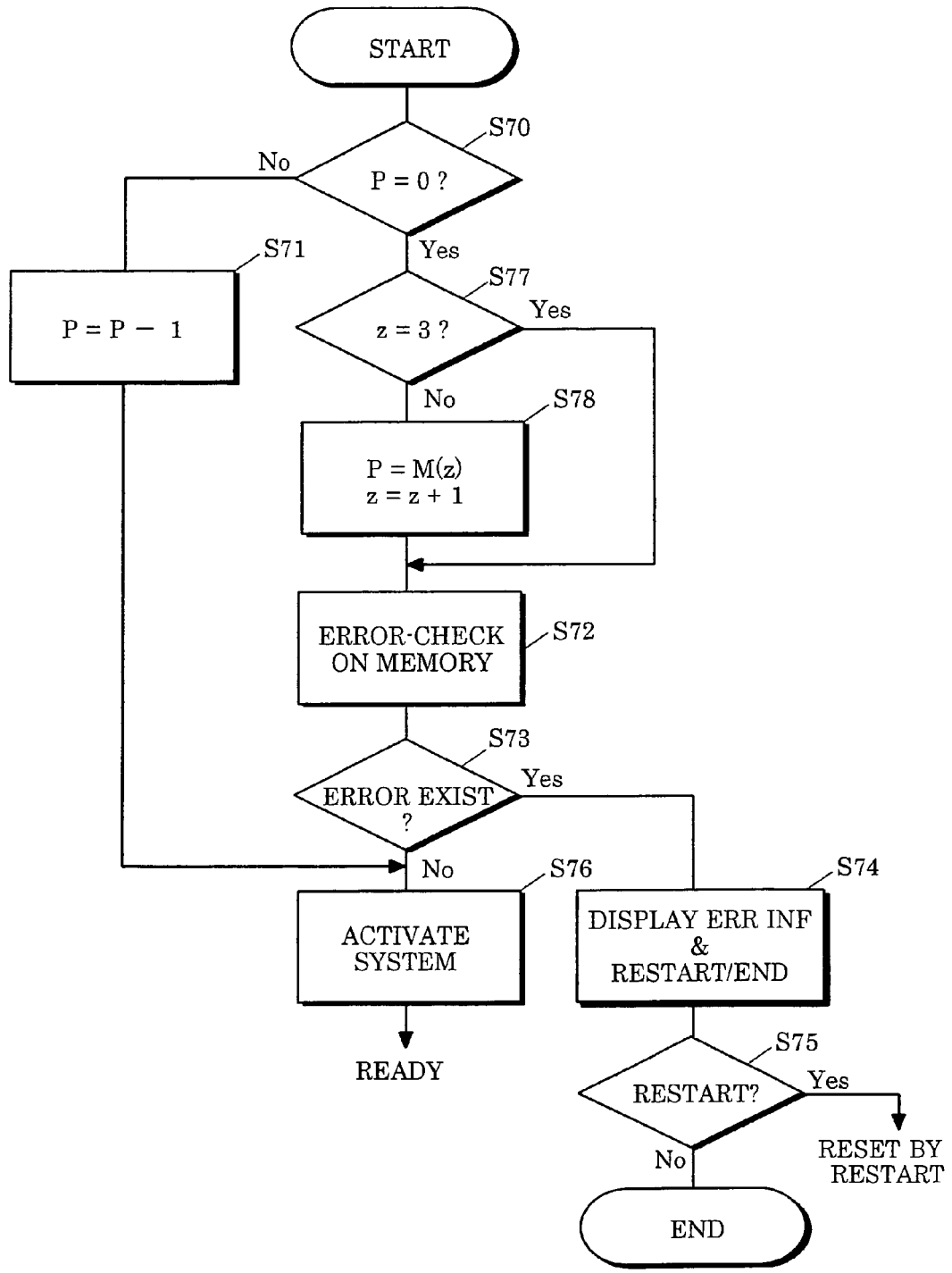
FIG. 15 is a flowchart showing a processing at power-on in an image forming apparatus, according to a seventh embodiment of the present invention.

FIG. 15 is a flowchart showing a program started at power-on, according to the seventh embodiment of the present invention.

Except steps S77 and S78 inserted between steps S70 and S72, FIG. 15 is the same as FIG. 14.

(S77) If the variable 'z' of round times is equal to '3', the process goes to step S72, or else, the process goes to step 78. The initial value of the variable 'z' is '0'.

(S78) The new initial value 'M(z)' is substituted for the set number of times 'P', and the 'z' is incremented by one.

By adding these processes, whether error-checking on memory is performed or not is shown in FIG. 17(A).

When the WDT interrupt occurs in the first round, it will be preferable to increase the number of error-checking times 'P'. In other words, by doing so, it is possible to relatively increase the initial value of the set number of times 'P' at the first round.

Figure 16:
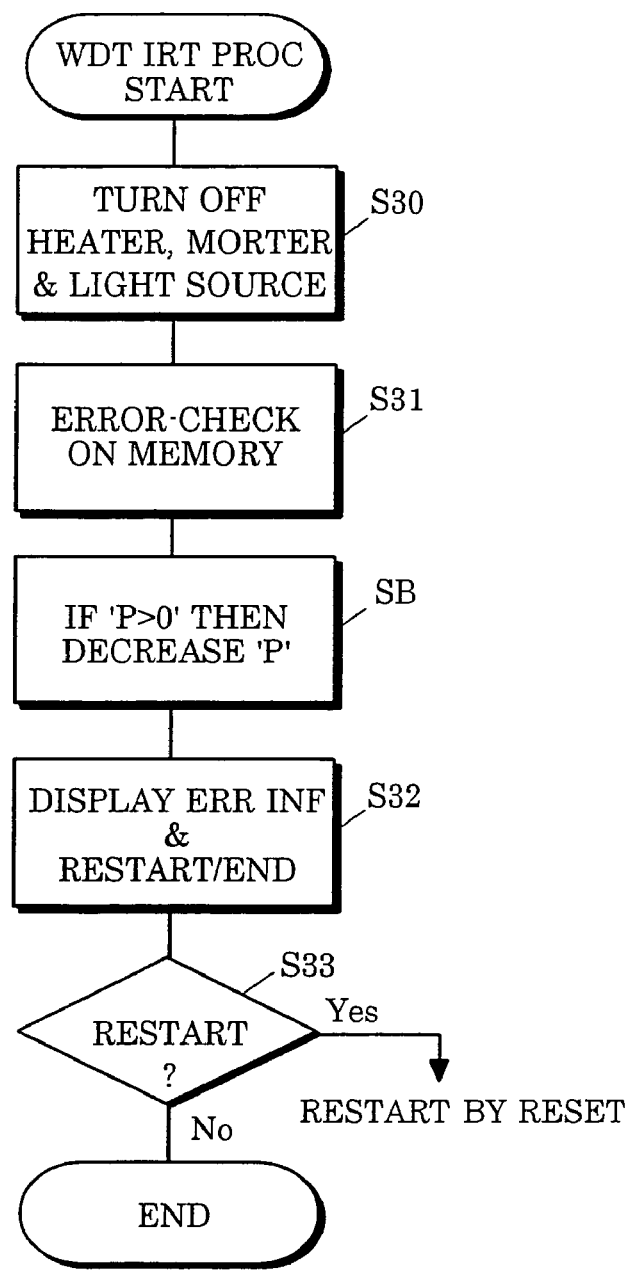
FIG. 16 is a flowchart showing a watchdog interruption processing.

FIG. 16 is a flowchart showing the WDT interruption processing with consideration of the above.

This WDT interruption processing decreases the set number of times 'P' if 'P' is greater than '0' at step SB between step S31 and step S32.

For example, the value [P/2], where [ ] means a rounding off operator to the nearest integer, is substituted for the set number of times 'P' so as to decrease 'P'. The others are the same as the processing of FIG. 6.

FIG. 17 (B) shows that the value of the set number of times 'P' decreases to '150' by generating the WDT interrupt at the time when the initial value of the set number of times 'P' is equal to '300' before update.

According to the seventh embodiment, after the number of total power-on times 'N' exceeds the initial value 'P', error-checking on memory is performed. Then, the initial value of the set number of times 'P' is updated to a smaller value, and further the set number of times 'P' is decreased when the WDT interrupt occurs with 'P' being more than '0'. Moreover error-checking on memory is performed when the WDT interrupt occurs. Thereby it is possible to reduce a margin of safety, which enables to relatively enlarge the initial value of the set number of times 'P' at the first round so as to increase the omitting number of times of error-checking on memory, resulting in preventing a user from feeling uncomfortable.

9. Eighth Embodiment

According to an eighth embodiment of the present invention, a timer 117, which is not used in the first embodiment described above and is coupled to the interface 116 as shown in FIG. 1, is used.

The timer 117 works by a battery 118 and with individual clock. If the present time 'Tn' matches with a set time 'Ts', a coincidence pulse is provided to an interrupt request terminal of the interface 116. The interface 116 interrupts the MPU 110 in response to this.

According to a program, the MPU 110 sets the present time 'Tn' and set time 'Ts', that are input with the control panel 12, through the interface 116 to the timer 117.

As described in the background of the invention, for enhancing the detection rate of memory error, it is preferable to execute the error-checking on memory in detail although it takes a long time.

On the other hand, a user turn on the image forming apparatus 10A when he wants to use it, so it is preferable to shorten the duration of system start-up.

According to the eighth embodiment, there is not performed error-checking on memory at power-on so as to shorten the system start-up duration and to reduce user's uncomfortable feeling. A detailed error-checking on memory begins at a set time 'Ts' set by a user. The set time 'Ts' is, for example, 12:30 during lunchtime.

Figure 18:
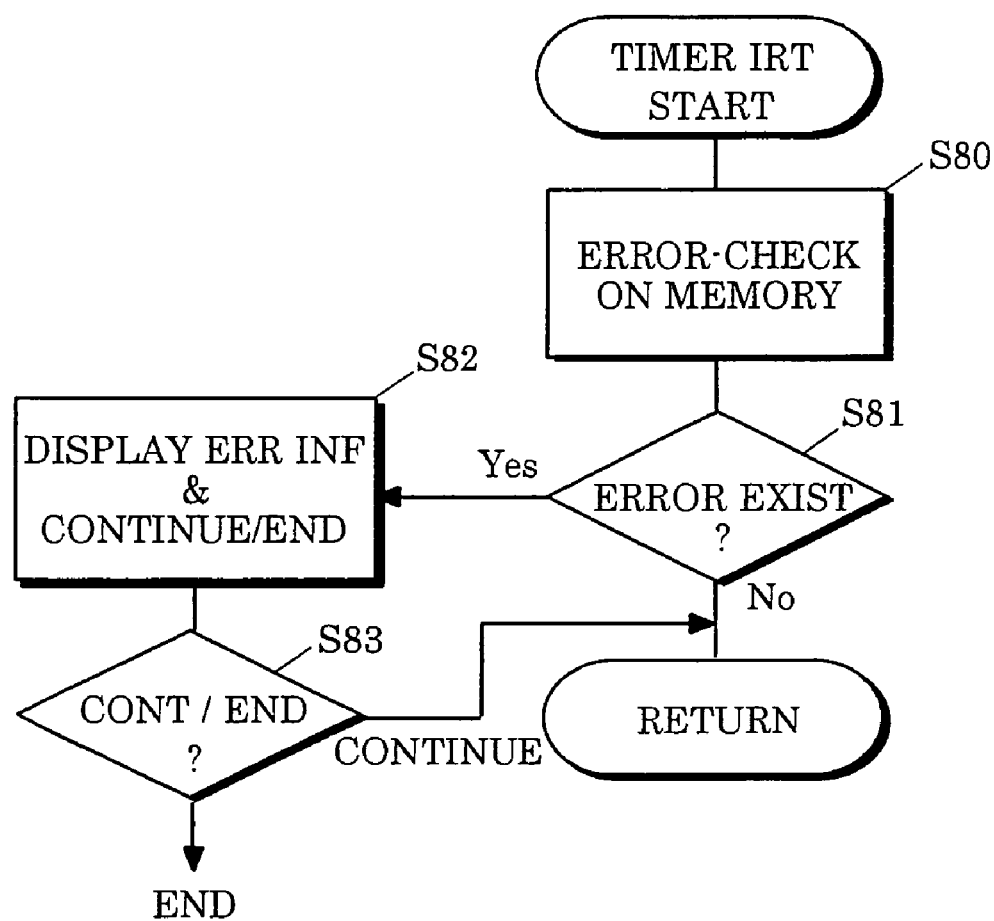
FIG. 18 is a flowchart showing the processing of a program started by a timer interrupt while booting up a system.

FIG. 18 shows a flowchart showing the processing of a program stored in the non-volatile memory 11A, and this program starts by the above interrupt.

(S80) error-checking is performed on the non-volatile memory 111A, 111B, and the volatile memory 112.

(S81) If an error is detected in step S80, the process goes to step S82, or else returns to the process before the interrupt.

(S82) Information pointing the location of memory error is displayed on the control panel 12. Additionally, to provide the alternative of 'continue' or 'end' to a user, these alternatives are displayed on the control panel 12.

(S83) If a user selects 'continue', the process continues the process before the interruption, or else, the process ends. In a case of 'end', the image forming apparatus 10A may be turned off.

According to the eighth embodiment, because of not error-checking on memory at power-on, the detailed error-checking on memory is performed when the present time 'Tn' matches the set time 'Ts'. Therefore, a user can activate the system in a short time and execute error-checking on memory in detail for a long time from the time 'Ts' while the image forming apparatus 10A is not used. Furthermore, due to the unnecessary of a change to a normal mode while error-checking on memory is performed, a user will not feel uncomfortable.

10. Ninth Embodiment

Figure 19:
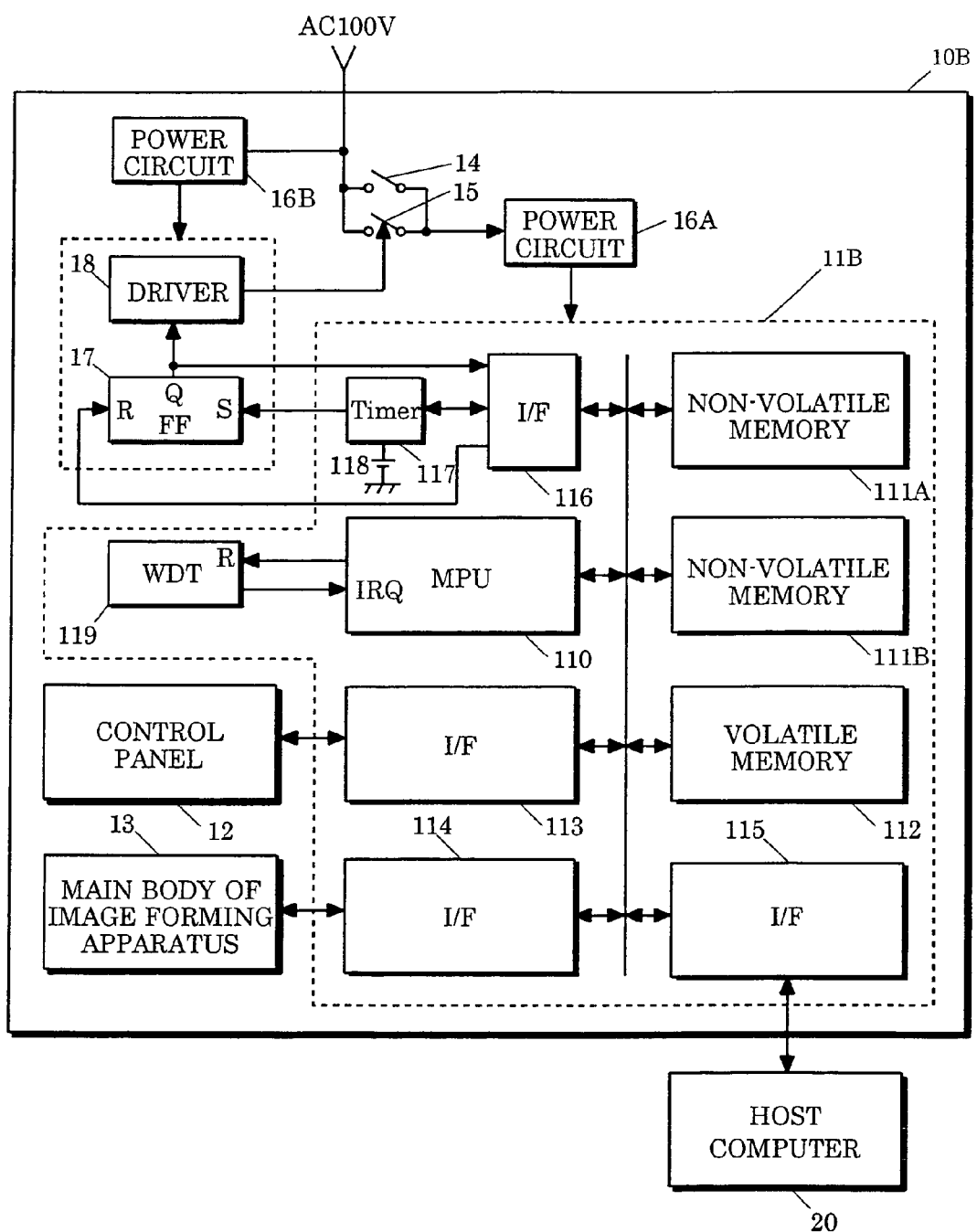
FIG. 19 is a schematic block diagram showing a hardware configuration of an image forming apparatus according to ninth and tenth embodiments of the present invention.

FIG. 19 is a schematic block diagram showing a hardware configuration of an image forming apparatus according to a ninth embodiment of the present invention.

In this image forming apparatus 10B, a commercial AC 100V power is supplied to a power supply circuit 16A through the parallel connection of a manual switch 14 and a controllable power switch 15, and is converted into a DC power to supply to each component of the controller 11B except the timer 117.

On-off control of the power switch 15 is operated by the output 'Q' of a flip-flop 17 through a driver 18. The flip-flop 17 is set by the time-out pulse of the timer 117 and is reset by the MPU 110 through the interface 116. The commercial AC power bypassing the switches 14 and 15 is converted into a DC power by a power supply circuit 16B, and the DC power is supplied to the flip-flop 17 and the driver 18. The power switch 15 is, for example, a relay contact. In this case, the driver 18 includes a relay coil which enables the relay contact to operate.

The present time 'Tn' and set time 'Ts' of the timer 117 are set as the eighth embodiment described above. The result of error-checking on memory is stored in the non-volatile memory 111B.

The others are the same as FIG. 1.

The set time 'Ts' is set at, for example, a three o'clock. When the present time 'Tn' becomes equal to the set time 'Ts', the flip-flop 17 is set by a time-out pulse from the timer 117, the power switch 15 is turned on to supply the power automatically.

Figure 20:
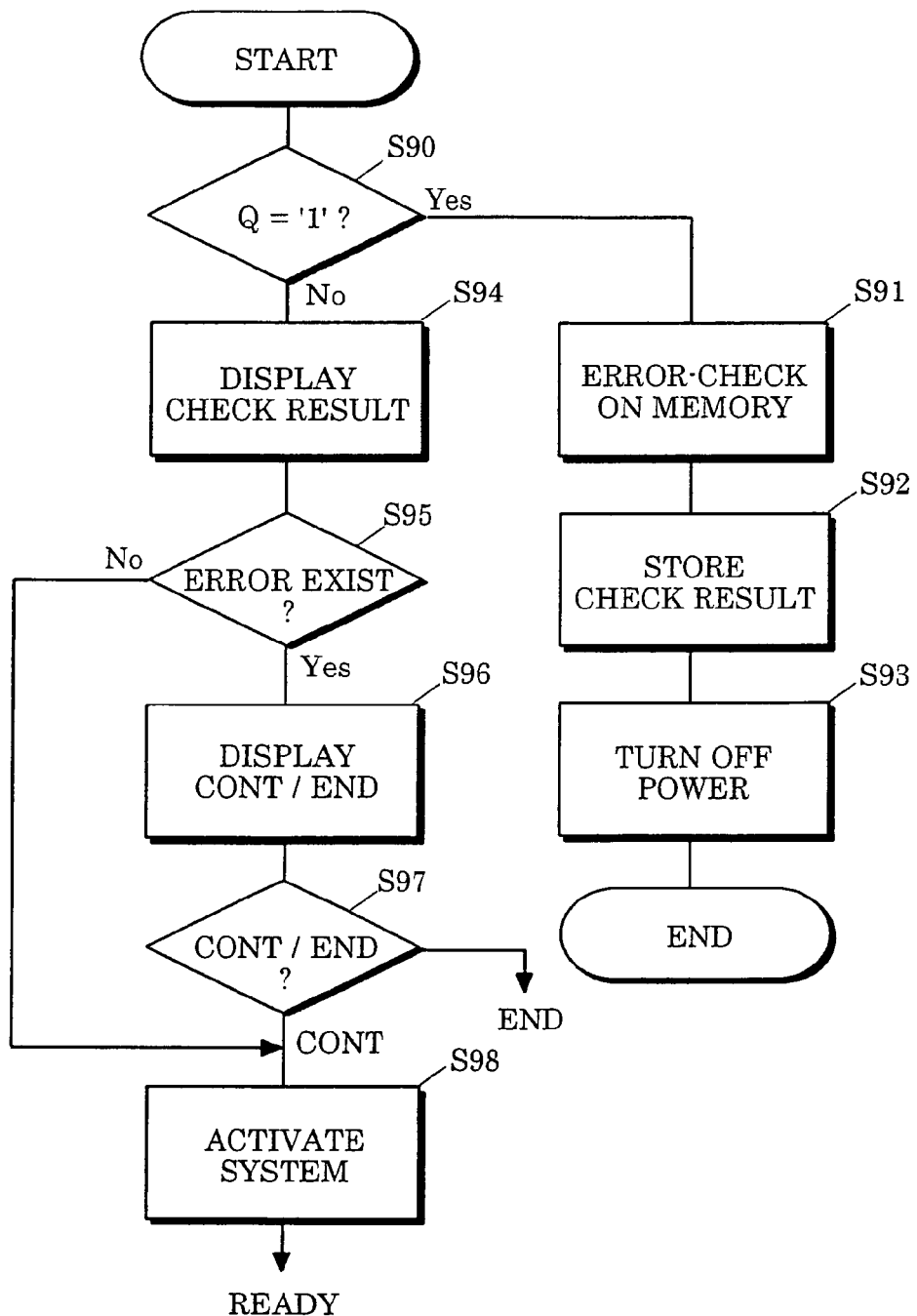

FIG. 20 is a flowchart showing the processing of a program which is stored in the non-volatile memory 111A and is started when the power becomes on automatically or manually.

(S90) If the output 'Q' of the flip-flop 17 is '1', the process goes to step S91 by determining that the power was turned on automatically, or else, the process goes to step S94 by determining that the power was turned on manually.

(S91) error-checking on memory is performed as described in the first embodiment.

(S92) The result of the error-checking on memory is stored in the non-volatile memory 111B.

(S93) The flip-flop 17 is reset and its output 'Q' is changed to '0' to causes the power switch 15 to be turned off. Thereby the image forming apparatus 10B is turned off and the process ends.

After that, when a user turn on the manual switch 14, following process is executed due to the determination that 'Q' is equal to '0' in step S90.

(S94) The result of the error-checking on memory is displayed on the control panel 12.

(S95) If the result indicates existence of a memory error, the process goes to step S96, or else, the process goes to step S98.

(S96) To provide the alternatives of 'continue' or 'end' of the process for a user, the alternatives are displayed on the control panel 12.

(S97) If a user selects 'continue', the process goes to step S98, or else, the process ends.

(S98) The OS and applications running over it are activated so that the image forming apparatus 10B goes ready.

According to the ninth embodiment, the power is turned on automatically and a detailed error-checking on memory is performed when the present time 'Tn' becomes the set time 'Ts'. The result of the error-checking on memory is stored in the non-volatile memory 111B and the power is off. When a user turns on the manual switch 14 next, the result of the error-checking on memory is displayed without error-checking on memory. Therefore, even if a large capacity of memories is installed in the image forming apparatus 10B, the system is activated in a short time, and this prevent a user from feeling uncomfortable because of the unnecessary of a change to a normal operation during error-checking on memory. Moreover, useless power cannot be consumed because the image forming apparatus 10B is off before and after error-checking on memory.

11. Tenth Embodiment

A hardware configuration according to a tenth embodiment of the present invention is the same as that of the ninth embodiment. In the tenth embodiment, the watchdog timer 119 described in the first embodiment is used with the configuration of the ninth embodiment.

The timer 117 has the functions as described in the ninth embodiment, and its output is enabled or disabled by the MPU10 through the interface 116. When the output is 'disable', its logic level is '0'.

Figure 21:
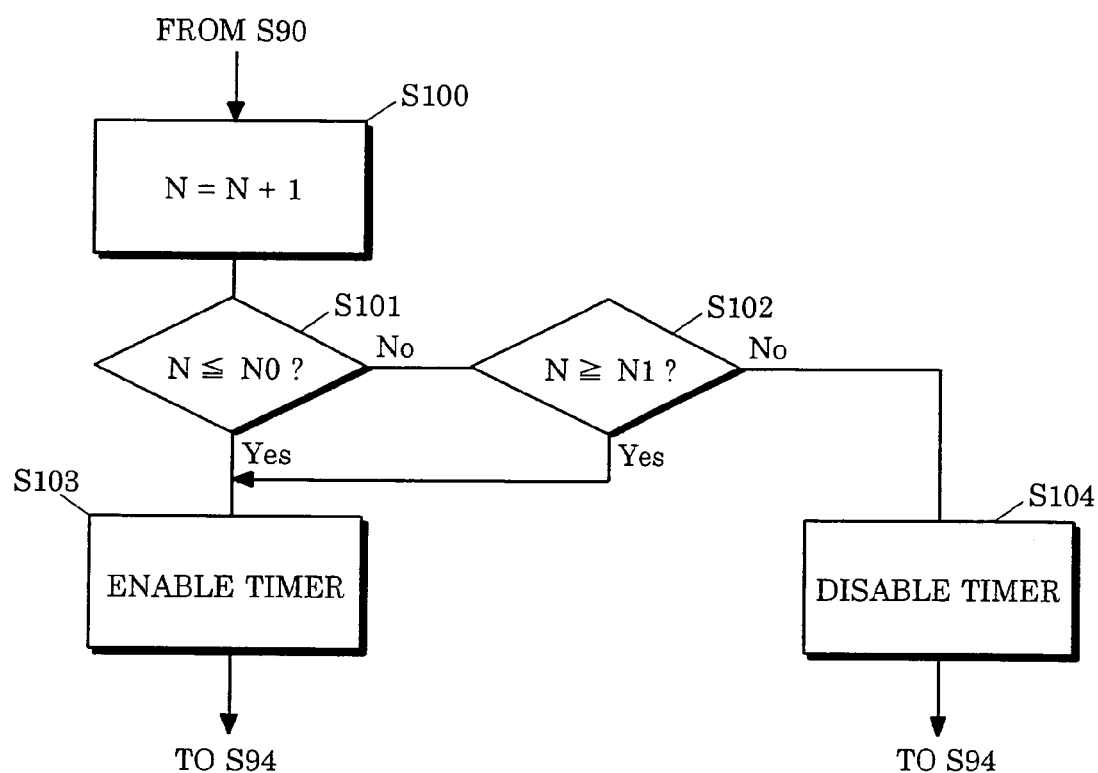

FIG. 21 is a flowchart showing a part of the processing of a program stored in the non-volatile memory 11A. This flowchart is added between step S90 and step S94 shown in FIG. 20.

(S100) The number of total power-on times 'N' is incremented by one.

(S101) If 'N' is less than or equal to 'N0', the process goes to step S103, or else, the process goes to step S102, where 'N0' is equal to the sum of a value corresponding to a margin of safety and a value corresponding to the end of the term having a relatively higher incidence of initial memory failure. The value 'N0' is, for example, '100', which is stored in the non-volatile memory 111A in advance.

(S102) If 'N' is greater than or equal to 'N1', the process goes to step S103, or else, the process goes to step S104, where 'N1' is equal to the difference between a value corresponding to the beginning of the term having a relatively higher incidence of memory failure due to secular change and a value corresponding to a margin of safety. The value 'N1' is, for example, '500' which is stored in the non-volatile memory 111A in advance.

(S103) The output of the timer 117 is made 'enable', and the process goes to step S94.

(S104) The output of the timer 117 is made 'disable', and the process goes to step S94.

Thereby a detailed error-checking on memory is performed at the set time 'Ts' only during the term when the incidence of memory error is relatively higher. In a case of others, error-checking on memory is performed neither at the set time 'Ts' nor at power-on, resulting in that the useless power consumption can be reduced.

For dealing with memory error during the term when the error-checking on memory is not performed, error-checking on memory is performed in the interruption processing generated by the time-out signal output from the watchdog timer 119 shown in FIG. 6.

According to the tenth embodiment, a detailed error-checking on memory is performed at the set time 'Ts' only during the term when the incidence of memory error is relatively higher. In a case of others, since error-checking on memory is performed only in the interruption processing caused by the watchdog timer 119, the consumption of power in the image forming apparatus 10B can be reduced more than that of the ninth embodiment.

12. Eleventh Embodiment

Figure 22:
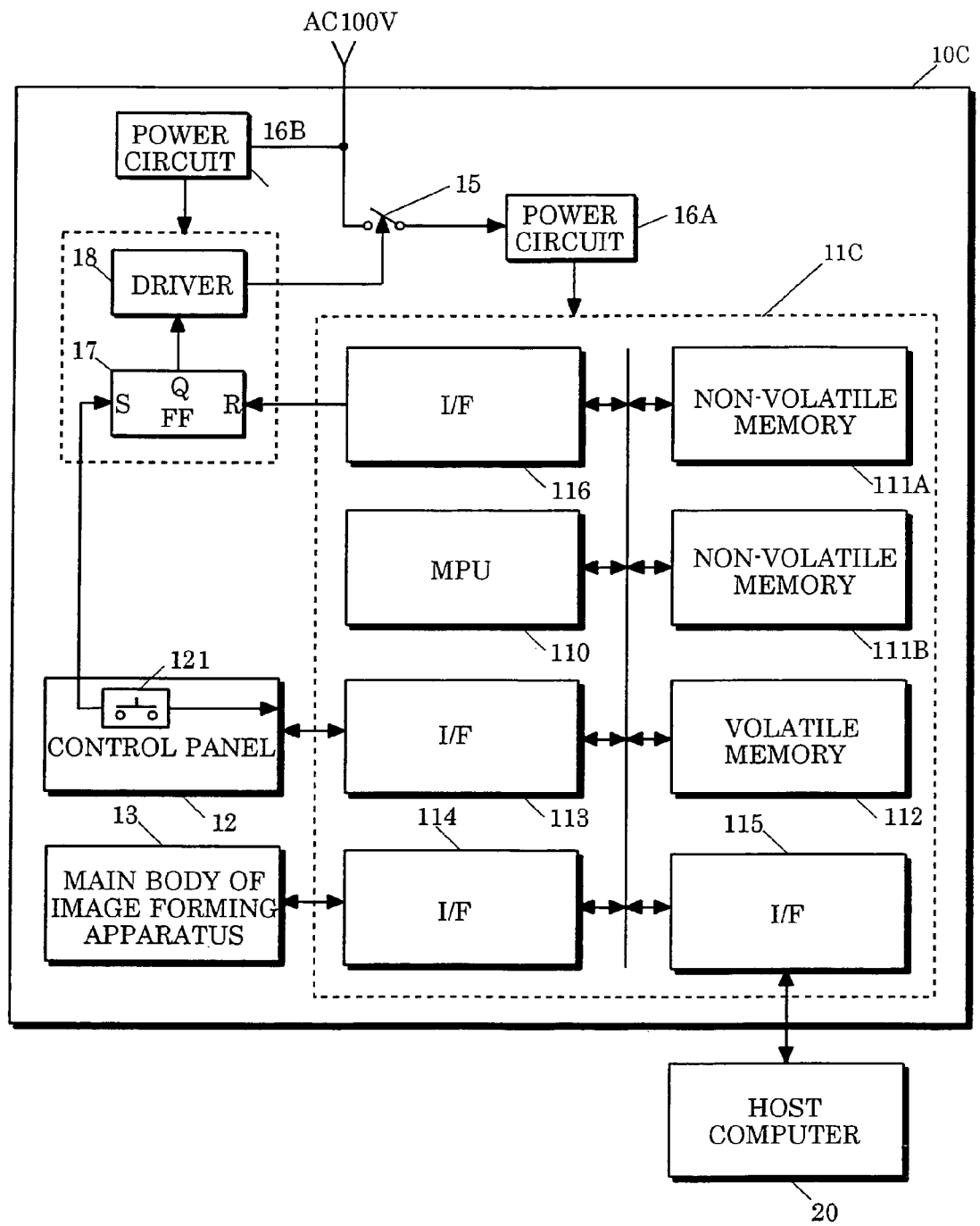
FIG. 22 is a schematic block diagram showing a hardware configuration of an image forming apparatus according to a eleventh embodiment of the present invention.

FIG. 22 is a schematic block diagram showing a hardware configuration of an image forming apparatus according to an eleventh embodiment of the present invention.

The commercial AC 100V power is supplied to the power supply circuit 16A through the controllable power switch 15, is converted into the DC power, and then is supplied to each component in controller 11C. The power switch 15 is, for example, a relay contact. In this case, the driver 18 includes a relay coil which operates the relay contact.

On-off control of the power switch 15 is operated by the output 'Q' of the flip-flop 17 through the driver 18. The commercial power bypassing the power switch 15 is converted into the DC power at the power supply circuit 16B, and the DC power is supplied to the flip-flop 17 and the driver 18.

The set input terminal 'S' and reset input terminal 'R' of the flip-flop 17 are coupled to a power control push button switch 121 of the control panel 12 and the output terminal of the interface 116, respectively. When the switch 121 is pushed, a power control instruction pulse is provided to the set input terminal 'S' of the flip-flop 17 and the interface 113.

The switch 121 works as a toggle switch for turning on and off alternately. Therefore, if the switch 121 is pushed down when the power switch 15 is off, the flip-flop 17 is set by the above-described pulse and then the power switch 15 is turned on. However, this pulse is ignored at the interface 113 because the controller 11C is off at the time when the pulse reaches the interface 113. On the other hand, if the switch 121 is pushed down when the power switch 15 is on, the state of the flip-flop 17 is not changed by the pulse since the flip-flop is already on. However, the pulse is accepted at the interface 113; the MPU 110 is interrupted; an interruption processing described below is executed; a reset pulse as a power-off instruction is provided to the reset input terminal 'R' of the flip-flop 17 through the interface 116; and then the power switch 15 is turned off.

The rest of the configuration is the same as FIG. 1.

Figure 23:
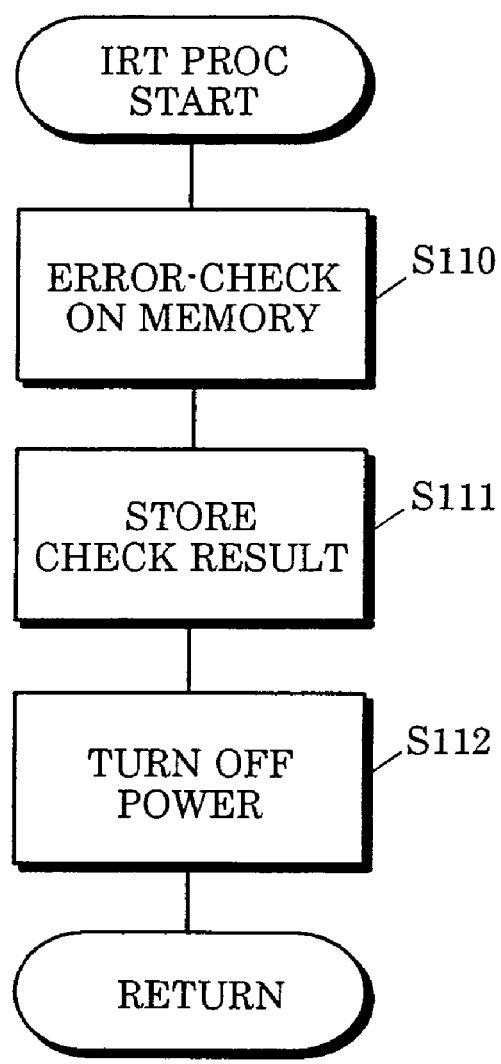
FIG. 23 is a flowchart showing a processing of a program started by a power-off interrupt instruction.

FIG. 23 shows a flowchart showing the processing of a program stored in non-volatile memory 111A. This program is started by the above interrupt.

(S110) Error-checking on memory is performed as a pre-processing of power-off. In this step, a detailed error-checking as described in the first embodiment is performed on the non-volatile memory 111A, 111B, and the volatile memory 112 because there is enough time to spend on executing error-checking on memory.

(S111) The result of the error-checking on memory is stored in the non-volatile memory 111B. More specifically, information that indicates whether memory error exist or not is stored in the non-volatile memory 111B, and if an error exist, information of error area is stored in the non-volatile memory 111B.

(S112) The reset pulse as a power-off instruction is provided to the reset input terminal 'R' of the flip-flop 17 through the interface 116. Thereby the power switch 15 is turned off to stop the power to the controller 11C.

Figure 24:
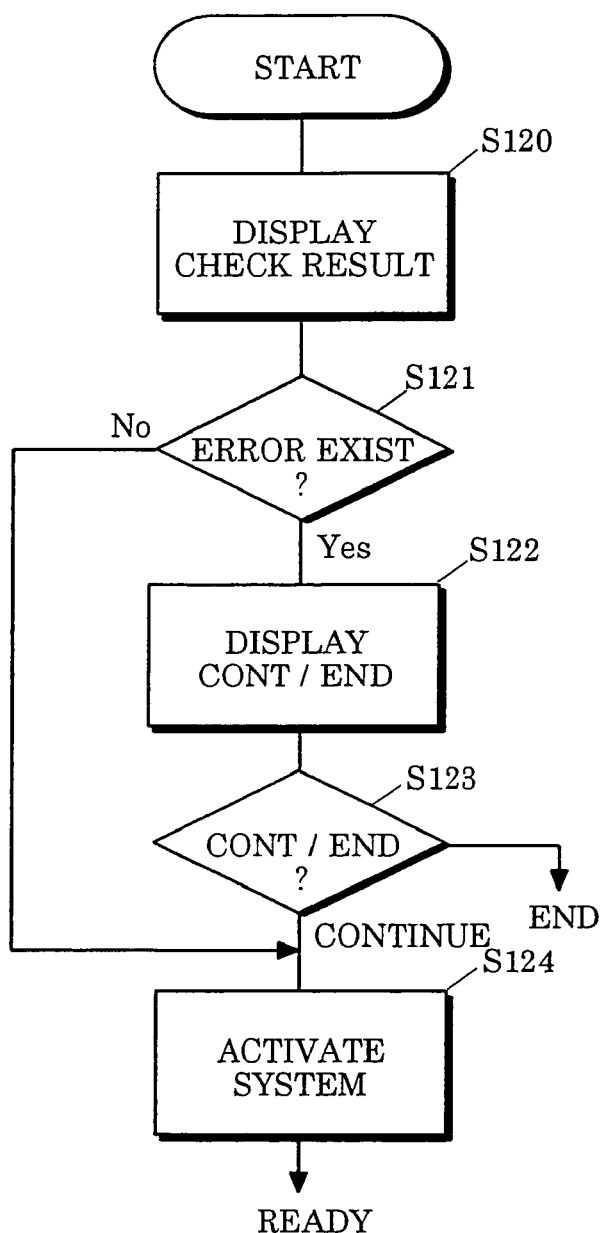

FIG. 24 is a flowchart showing the process at the time when the controller 11C is turned on after the power switch 15 is toggled on by a user's pushing down the switch 121 under the condition of the controller 11C being off.

(S120) The result of the error-checking on memory is read from the non-volatile 111B and is displayed on the control panel 12.

(S121) If this result indicates that memory error exist, the process goes to step S122, or else, the process goes to step S124.

(S122) To provide the alternative of 'continue of the process' or 'end of the process' for a user, these alternatives are displayed on the control panel 12.

(S123) If a user selects 'continue of the process', the process goes to step S124, or else, the process ends. In a case of 'end of the process', the reset pulse is provided to the reset input terminal 'R' of the flip-flop 17, and the power switch 15 may be turned off.

(S124) The OS and applications running over it are activated, so that the image forming apparatus 10C goes ready.

Figure 25:
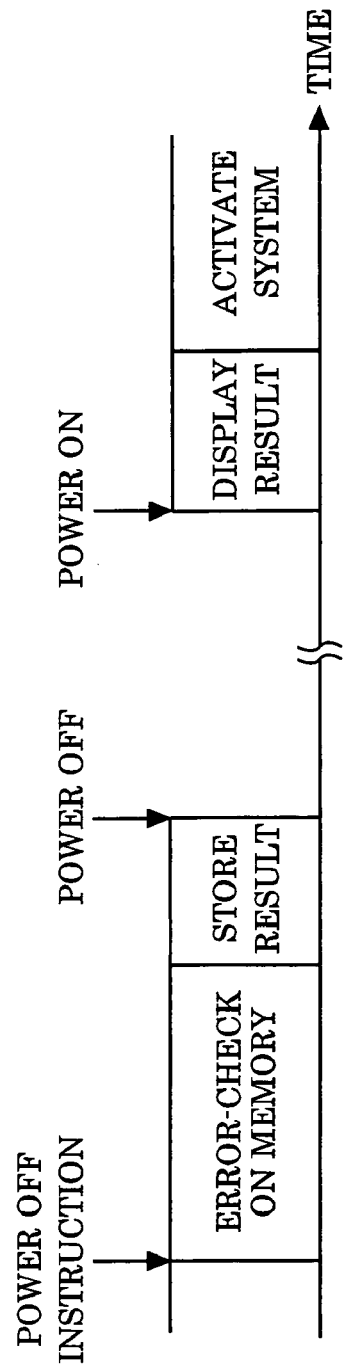
FIG. 25 is a time chart showing the outline of a processing of FIG. 23 and FIG. 24.

According to the eleventh embodiment, as shown in FIG. 25, a detailed error-checking on memory is performed with taking an enough time as a preprocessing of power-off in response to a power-off instruction, and the result of error-checking on memory is stored in non-volatile memory 111B. Moreover, at the next power-on, error-checking on memory is not performed but only the memory error result is displayed. Thereby a user can activate the system within a short time together with enhancing the detection rate of memory error, without giving a user uncomfortable feeling. In addition, since error-checking on memory is done when the power switch 121 is turned off, it is unnecessary to change to the normal mode during the check. Thereby a user does not feel uncomfortable.

There may be a case where image degradation occurs by a memory error while the power of image forming apparatus 10C is on.

Therefore, a program displays the menu of error-checking types on the control panel 12 in response to operations on the control panel 12, and executes error-checking on memory in response to a user's selection.

Figure 26:
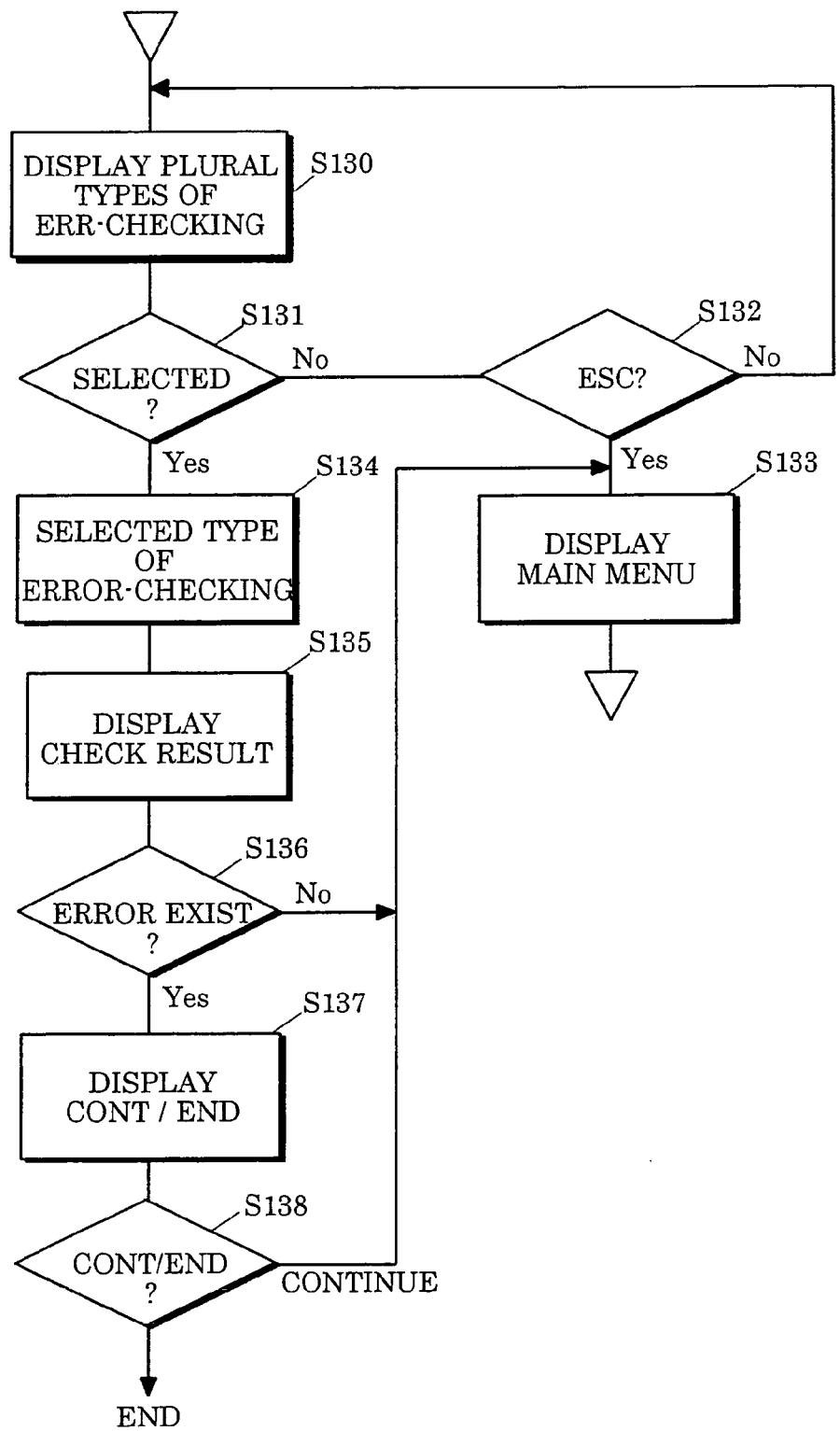
FIG. 26 is a flowchart showing a processing of error-checking on memory started in response to user's operation.

FIG. 26 is a flowchart showing this processing.

(S130) Plural types of error-checking which a user can select are displayed on the control panel 12. For example, following alternatives are displayed as checking targets: 'non-volatile memory 111A', 'non-volatile memory 111B', 'volatile memory 112', and 'all the memories'. In a case of the volatile memory 112, such as following check patterns are displayed as alternatives on the control panel 12: '01010101', '10101010', '00000000', '11111111', and 'all these patterns'. In both cases, a user can select one or more.

(S131) If a user has completed the selection, the process goes to step S134, or else, the process goes to step S132.

(S132) If an escape key is pushed, the process goes to step S133, or else, the process goes back to step S130.

(S133) The process goes back to a main menu.

(S134) The selected error-checking on memory is performed as described above.

(S135) The result of the check is displayed on the control panel 12.

(S136) If a memory error has detected, the process goes to step S137, or else, the process goes to step S133.

(S137) To provide the alternatives of 'continue' or 'end' of the process for a user, the alternatives are displayed on the control panel 12.

(S138) If a user selects 'continue', the process goes to step S133, or else, the process ends. In a case of 'end', the pulse may be provided to the reset input terminal 'R' of the flip-flop 17 to turn off the power switch 15.

According to the eleventh embodiment, in response to user's operations, an error-checking selected from plural types of error-checking is performed. Thus, it is possible to deal with the image degradation due to memory error arisen while the power of image forming apparatus 10C is on.

Although preferred embodiments of the present invention has been described, it is to be understood that the invention is not limited thereto and that various changes and modifications may be made without departing from the spirit and scope of the invention.

For example, error-checking may be performed at least on the volatile memory 112.

Although a case where a program is stored in the non-volatile memory 111A is explained in all the embodiments described above, a program may be stored in any other non-volatile storage such as a hard disk.

Since a system reset is generally executed at power-on, the expression of 'at power-on' means 'at power-on' or 'at system-reset' in the present specification and claims.

In addition, the watchdog timer described above may be a configuration built in a MPU.

Moreover, in the above second, third, forth, eighth and tenth embodiments, a case are explained where error-checking is not performed on the non-volatile memory 111A and 111B at power-on. However, error-checking may be performed at power-on on the whole area or a divided area(s) such as a case of volatile memory 112 described above.

Furthermore, in stead of error-checking on memory in FIG. 6, 12, or 16, error-checking on memory may be performed at the next power-on in the corresponding embodiment.

In the ninth and tenth embodiments, it is determined from the output 'Q' of the flip-flop 17 whether the power supply circuit 16A is turned on as a system power by the power switch 15. However, it may be determined that the system power is on by the power switch 15 if the difference between the present time and the set time of the timer 117 is less than a threshold value.

In the eleventh embodiment, although the power-off instruction is provided to the image forming apparatus 10C by user's pushing the power control push button 121, the present invention can be also applied to case where the image forming apparatus 10C is automatically turned off due to leaving it untouched for more than a set time. In this case, when the image forming apparatus 10C is left untouched for more than the set time, it is assumed that the power-off instruction is provided to the image forming apparatus 10C, and then the processing of FIG. 23 starts.

Moreover in the eleventh embodiment, since the configuration of executing error-checking on memory in response to user's selection is subsidiary, this configuration may be combined with any other embodiment.

What is claimed is:

1. An image forming apparatus, comprising:
   a processor;
   storage means, coupled to the processor, for storing a computer program;
   a volatile memory, coupled to the processor;
   a non-volatile memory, coupled to the processor, for storing information about an area targeted for error-checking, the information indicating one of a plurality of memory blocks into which the whole memory area of the volatile memory is divided; and
   a display device, coupled to the processor;
   wherein the computer program causes the processor to perform the steps of:
   (a) executing error-checking on an area indicated by the information at every power-on;
   (b) updating the information so as to complete the error-checking on the whole memory area of the volatile memory in a plurality of times of power-on; and
   (c) if a memory error has been detected, displaying information thereof on the screen of the display device,
   wherein the area targeted for the error-checking is a group of 'm memory blocks (m<n) which are away from each other and are selected out of 'n' memory blocks into which the whole memory area is equally divided, the 'n' memory blocks being grouped into 'k' groups (k>=2) so that each group does not overlap to any other group,
   wherein in step (b), the computer program causes the processor to update the information about an area targeted for the error-checking so as to shift error-checking one of the 'k' groups sequentially at every power-on
   wherein the non-volatile memory further stores information which indicates a number of total power-on times and information which indicates a setting of the number of total power-on times, and
   wherein in step (b), the computer program causes the processor to perform the steps of:
   (b1) updating the information which indicates the number of total power-on times at every power-on; and
   (b2) if the number of total power-on times is more than the setting of the number of total power-on times, executing the error-checking on one group out of the 'k' groups, and updating the information about an area targeted for the error-checking so as to be shifted sequentially at every power-on.

2. The image forming apparatus according to claim 1, further comprising a watchdog timer, coupled to the processor or built in the processor, for interrupting the processor by detecting a time-out,
   wherein the computer program further causes the processor to perform the steps of:
   (d) executing the error-checking on the whole memory area of the volatile memory in response to the interrupt; and
   (e) if a memory error has been detected, displaying information thereof on the screen of the display device.

3. An image forming apparatus, comprising:
   a processor;
   a memory, coupled to the processor, for storing a computer program and data;
   a non-volatile memory, coupled to the processor, for storing interrupt information;
   a display device coupled to the processor; and
   a watchdog timer, coupled to the processor or built in the processor, for interrupting the processor by detecting a time-out;
   wherein the computer program causes the processor to perform the steps of:
   (a) in response to the interruption, writing the interruption information indicating that the interruption has occurred into the non-volatile memory, executing error-checking on the memory, and if a memory error has been detected, displaying information thereof on a screen of the display device;
   (b) at a power-on, determining whether the interruption information indicates that the interruption has occurred; and
   (c) if the interruption has occurred, executing error-checking on the memory at a power-on, and if a memory error has been detected, displaying information thereof on the screen of the display device.

4. The image forming apparatus according to claim 3, wherein the interruption information indicates a number of times, the computer program causes the processor to decrement the number of times whenever executing the error-checking on the memory at a power-on, and to regard the information indicating that the interruption has occurred as being cleared if the number of times becomes zero.

5. An image forming apparatus, comprising:
   a processor;
   a memory, coupled to the processor, for storing a computer program and data;
   a non-volatile memory, coupled to the processor, for storing information indicating numbers of times consisting of a number of total power-on times and a set number of times;
   a display device coupled to the processor;
   wherein the computer program causes the processor to perform the steps of:
   (a) updating the information indicating the number of total power-on times at every power-on;
   (b) if the information indicates that the number of total power-on times becomes equal to the set number of times, executing error-checking on the memory and; and
   (c) if a memory error has been detected, displaying information thereof on the screen of the display device.

6. The image forming apparatus according to claim 5, further comprising a watchdog timer, coupled to the processor or built in the processor, for detecting a time-out to interrupt the processor,
   wherein the computer program further causes the processor to execute error-checking on the memory in response to the interruption, and if a memory error has been detected, to display information thereof on the screen of the display device.

7. The image forming apparatus according to claim 6, wherein the computer program further causes the processor, in response to the interruption, to change the set number of times so that the number of power-on times between error-checking further decreases.

8. An image forming apparatus, comprising:
   a processor;
   storage means, coupled to the processor, for storing a computer program;
   a volatile memory coupled to the processor;
   interactive inputting means, coupled to the processor, for inputting information of a set time;
   timer means, for counting a present time and interrupting the processor directly or indirectly by activating a time-out signal when the present time becomes equal to the set time;
   a display device coupled to the processor; and
   an electrically writable non-volatile memory coupled to the processor,
   wherein the computer program causes the processor to perform the steps of:
   (a) executing error-checking on the volatile memory in response to the interruption; and
   (b) displaying information that indicates a result of the error-checking on a screen of the display device
   wherein the timer means includes a system power control means working with a power independent from a system power of the image forming apparatus, turning on the system power when the present time becomes equal to the set time, and turning off the system power in response to activation of a reset signal,
   the interruption is a power-on interruption;
   wherein the computer program further causes the processor to perform the steps of, between the step (a) and (b):
      storing information indicating a result of error-checking into the non-volatile memory; and
      activating the reset signal,
   wherein in the step (b), the computer program causes the processor to read from the non-volatile memory the information indicating the result of the error-checking if the system power has been turned on manually so as to display the information indicating the result of the error-checking on the screen of the display device,
   wherein the non-volatile memory further stores information of a number of total power-on times,
   wherein the computer program further causes the processor to perform the step of updating the information of the number of total power-on times at every power-on, and
   wherein the step (a) is performed if the information of the number of total power-on times indicates more than a first set value and if the system power is turned on by the system power control means.

9. The image forming apparatus according to claim 8, wherein the system power control means includes:
   a switch, having a control input terminal, for turning the system power on and off selectively; and a flip-flop, having an output terminal coupled to the control input terminal of the switch, being set by activation of the time-out signal, being reset by activation of the reset signal.

10. The image forming apparatus according to claim 9, wherein in step (b), the computer program causes the processor to determine whether the system power is turned on by the system power control means or manually based on a signal level at the output terminal of the flip-flop.

11. The image forming apparatus according to claim 8, wherein the step (a) is performed if the information of the number of total power-on times indicates less than a second set value and if the system power is turned on by the system power control means.

12. The image forming apparatus according to claim 8, further comprising a watchdog timer, coupled to the processor or built in the processor, for interrupting the processor by detecting a time-out,
wherein the computer program further causes the processor, in response to the interruption, to execute the error-checking on the volatile memory, and if a memory error has been detected, to display information thereof on the screen of the display device.

13. An image forming apparatus, comprising:
a processor;
storage means, coupled to the processor, for storing a computer program;
a volatile memory coupled to the processor;
an electrically writable non-volatile memory coupled to the processor;
interactive input means, coupled to the processor, for inputting a system power-off instruction;
power control means, coupled to the processor, for turning off the system power in response to the system power-off instruction; and
a display device coupled to the processor;
wherein the computer program causes the processor to perform the steps of:
in response to the power-off instruction of the system power, executing error-checking on the volatile memory, and providing the power-off instruction to the power control means after storing information indicating a result of the error-checking into the non-volatile memory; and
in response to turning on the system power, reading the information of the result of the error-checking stored in the non-volatile memory and displaying the information on a screen of the display device.

14. The image forming apparatus according to claim 13, wherein the interactive inputting means is also for inputting an error-checking instruction,
wherein the computer program further causes the processor to execute error-checking on the volatile memory in response to an input of the error-checking instruction and, to display information of a result of the error-checking on the screen of the display device.

15. The image forming apparatus according to claim 14, wherein the computer program further causes the processor to display an image for selecting one or more of a plurality of error-checking types on memory on the screen of the display device, and to execute error-checking of a types selected through the interactive inputting means.

* * * * *